(12) United States Patent
Hsu et al.

(10) Patent No.: US 12,461,440 B2
(45) Date of Patent: Nov. 4, 2025

(54) PELLICLE MEMBRANE WITH IMPROVED PROPERTIES

(71) Applicant: Taiwan Semiconductor Manufacturing Company, Hsinchu (TW)

(72) Inventors: Pei-Cheng Hsu, Taipei (TW); Wei-Hao Lee, Taipei (TW); Ting-Pi Sun, Taichung (TW); Chia-Tung Kuo, Hsinchu (TW); Huan-Ling Lee, Hsinchu (TW); Hsin-Chang Lee, Zhubei (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 652 days.

(21) Appl. No.: 17/854,133

(22) Filed: Jun. 30, 2022

(65) Prior Publication Data

US 2024/0004284 A1  Jan. 4, 2024

(51) Int. Cl.
| | |
|---|---|
| *G03F 1/64* | (2012.01) |
| *B82Y 40/00* | (2011.01) |
| *G03F 1/48* | (2012.01) |

(52) U.S. Cl.
CPC .......... *G03F 1/64* (2013.01); *B82Y 40/00* (2013.01); *G03F 1/48* (2013.01)

(58) Field of Classification Search
CPC .................. G03F 1/62; G03F 1/64
See application file for complete search history.

(56) References Cited

U.S. PATENT DOCUMENTS

| | | | |
|---|---|---|---|
| 9,958,770 B2 | 5/2018 | Ahn et al. | |
| 11,092,886 B2 | 8/2021 | Timmermans et al. | |
| 11,237,474 B2 | 2/2022 | Nishimura | |
| 12,153,339 B2 * | 11/2024 | Hsu | G03F 1/82 |
| 2018/0329291 A1 * | 11/2018 | Timmermans | G03F 1/64 |
| 2019/0079388 A1 * | 3/2019 | Fender | G03F 1/82 |

(Continued)

FOREIGN PATENT DOCUMENTS

| | | |
|---|---|---|
| CN | 106233202 A | 12/2016 |
| CN | 108878259 A | 11/2018 |

(Continued)

OTHER PUBLICATIONS

T.S Gspann, et al, Spinning of Carbon nanotube fibres using the floating catalyst high temperature route: purity issues and the critical role of sulphur, The Royal Society of Chemistry 2013, Jan. 2012, pp. 1-10, Faraday Discussions Manuscript, RSC Publishing, DOI:10.1039/xoxx0000ox.

(Continued)

*Primary Examiner* — Martin J Angebranndt
(74) *Attorney, Agent, or Firm* — Lippes Mathias LLP

(57) ABSTRACT

A pellicle assembly includes a pellicle membrane with a nanotube layer formed from thick nanotube bundles. The pellicle membrane can be formed with multiple layers and has a combination of long lifetime, high transmittance, low deflection, and small pore size. A conformal coating may applied to an outer surface of the pellicle membrane. The conformal coating protects the pellicle membrane from damage that can occur due to heat and hydrogen plasma created during EUV exposure.

20 Claims, 31 Drawing Sheets

(56) References Cited

U.S. PATENT DOCUMENTS

| | | |
|---|---|---|
| 2019/0129300 A1* | 5/2019 | Ono .................... H01L 21/0274 |
| 2019/0302608 A1 | 10/2019 | Hamada |
| 2020/0174361 A1 | 6/2020 | Yanase |
| 2020/0201169 A1 | 6/2020 | Mariano Juste et al. |
| 2020/0272047 A1* | 8/2020 | Chatterjee .............. B01J 37/347 |
| 2020/0355995 A1 | 11/2020 | Kim et al. |
| 2022/0365420 A1* | 11/2022 | Hsu ........................... G03F 1/62 |
| 2022/0413378 A1* | 12/2022 | Lin ........................... G03F 1/64 |
| 2023/0026114 A1* | 1/2023 | Lee ........................... G03F 1/64 |
| 2023/0135538 A1* | 5/2023 | Hsu ........................... G03F 1/64 |
| | | 430/5 |
| 2023/0236496 A1* | 7/2023 | Hsu ....................... C01B 21/064 |
| | | 430/5 |

FOREIGN PATENT DOCUMENTS

| | | | |
|---|---|---|---|
| CN | 111352295 A | 6/2020 | |
| CN | 114609859 A | 6/2022 | |
| EP | 3483655 A1 | 5/2019 | |
| EP | 3674797 A1 * | 7/2020 | ............... G03F 1/62 |
| TW | 202043910 A | 12/2020 | |
| TW | 202140378 A | 11/2021 | |
| WO | WO-2020243113 A1 * | 12/2020 | |
| WO | WO-2022196182 A1 * | 9/2022 | |
| WO | WO-2023117853 A1 * | 6/2023 | ............... G03F 1/62 |

OTHER PUBLICATIONS

Wondong Cho, et al, Growth and characterization of vertically aligned centimeter long CNT arrays, ScienceDirect, Feb. 7, 2014, pp. 264-273, Carbon 72, Elsevier.

Taiwan Office Action Application No. 11320680730—Dated: Jul. 3, 2024.

* cited by examiner

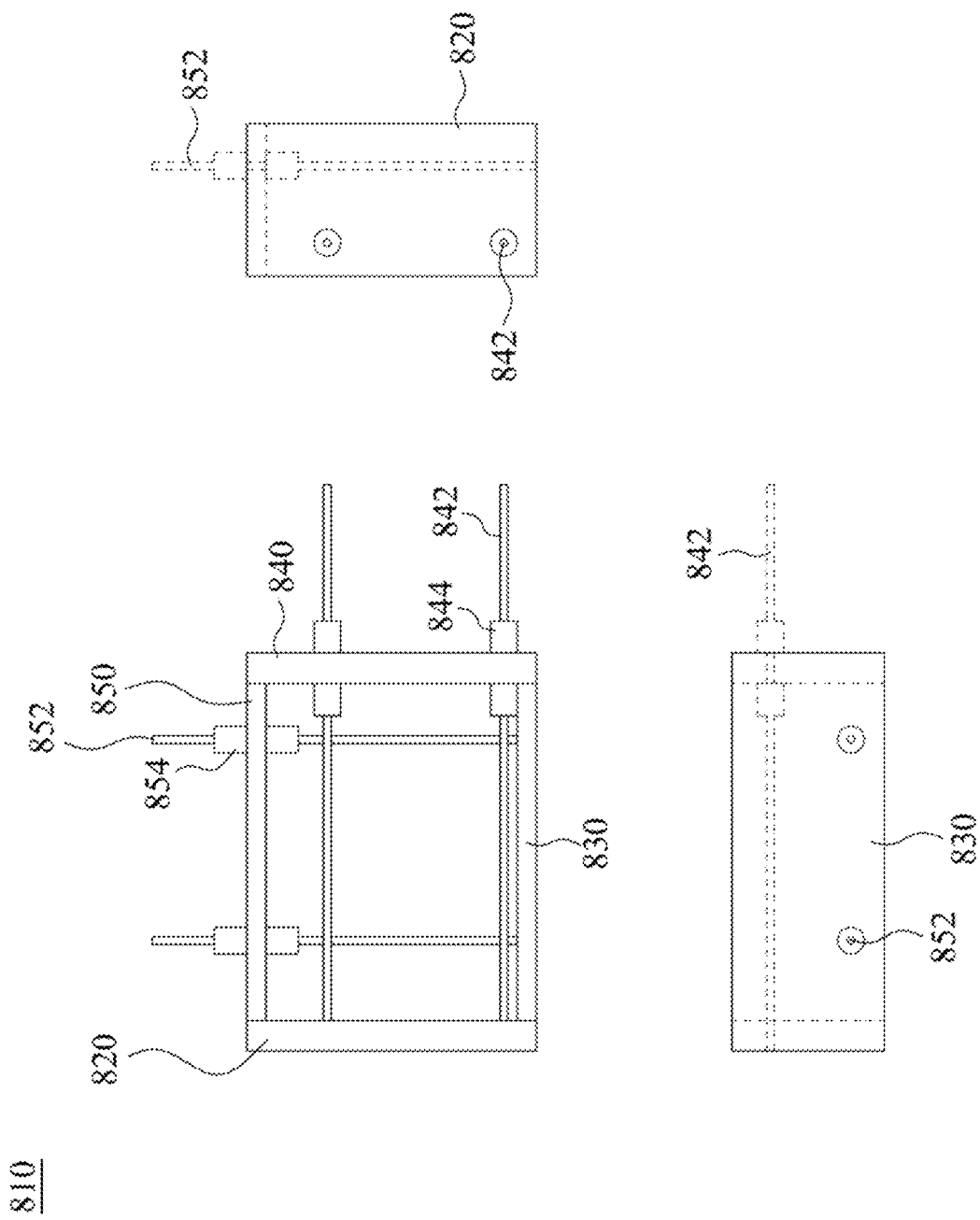

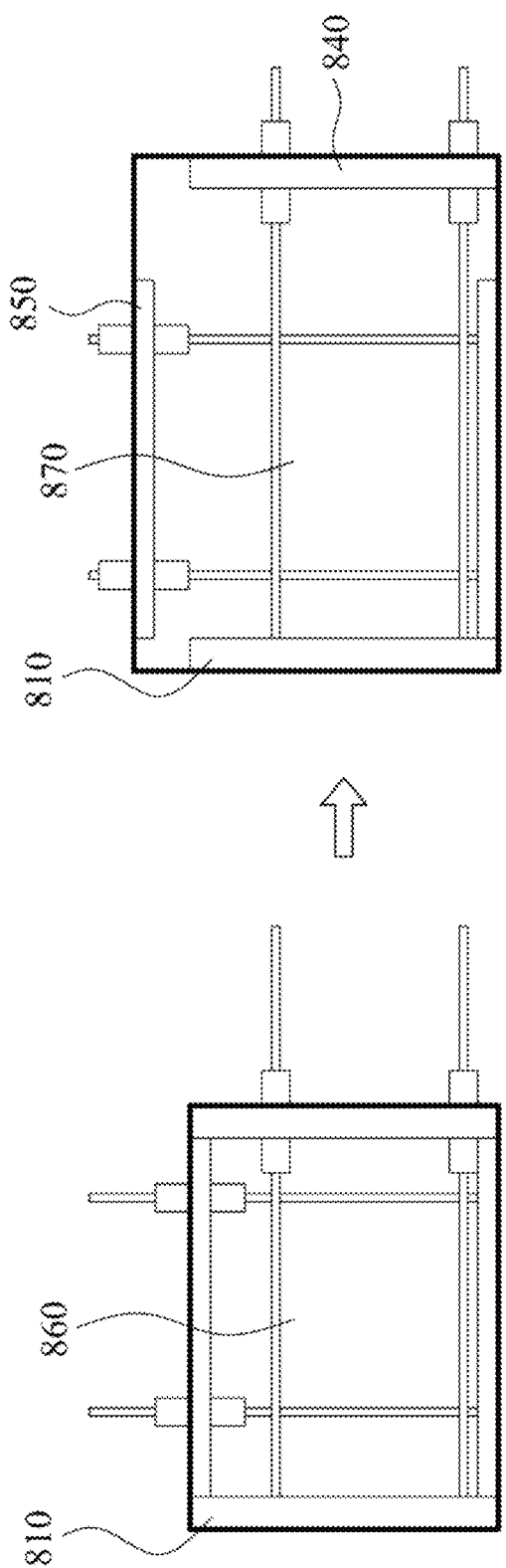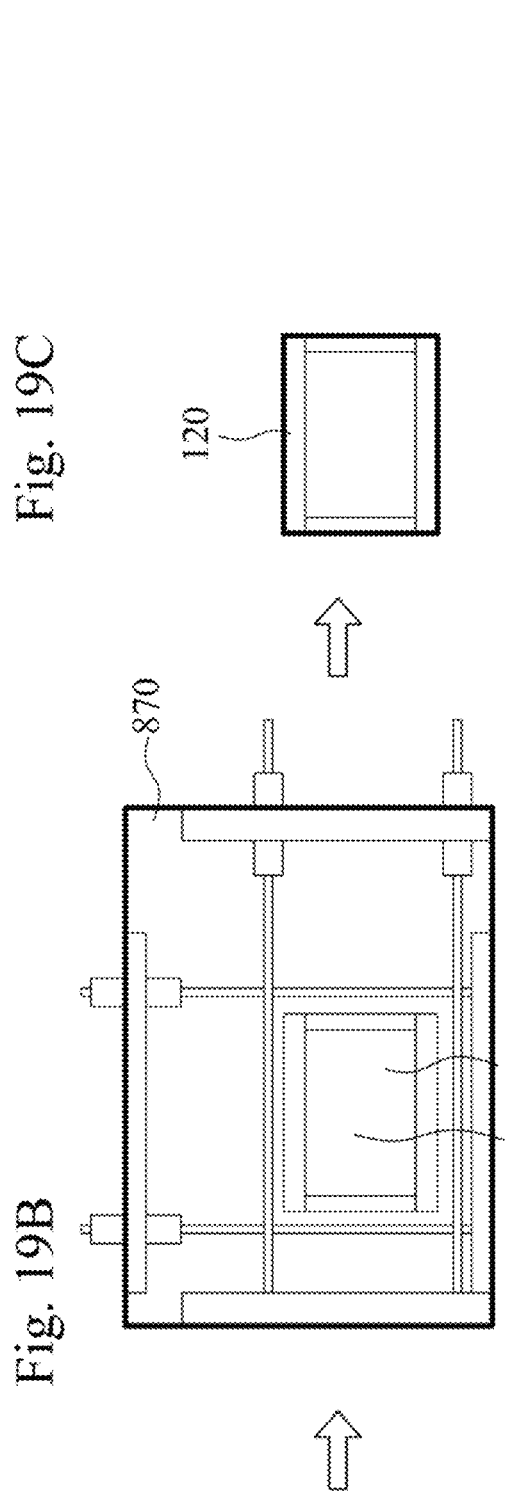
Fig. 19B
Fig. 19C
Fig. 19D

PELLICLE MEMBRANE WITH IMPROVED PROPERTIES

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. At such short wavelengths, particle contaminants on the photomask can cause defects in the transferred pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a first embodiment. FIG. 2B is a second embodiment. FIG. 2C is a third embodiment. FIG. 2D is an axial view, showing additional detail of one layer. FIG. 2E is a plan view, showing additional detail of one layer.

FIG. 6A is a first embodiment, FIG. 6B is a second embodiment, FIG. 6C is a third embodiment, and FIG. 6D is a fourth embodiment.

FIG. 7A is a plan cross-sectional view, FIG. 7B is a first side view, and FIG. 7C is a front side view.

FIG. 11A is a first diagram, and FIG. 11B is a second diagram.

FIG. 13A is a first diagram, FIG. 13B is a second diagram, and FIG. 13C is a third diagram.

FIG. 15A is a first diagram, FIG. 15B is a second diagram, and FIG. 15C is a third diagram.

FIG. 16A is an embodiment with a single-layer coating.
FIG. 16B is a first embodiment with a two-layer coating.
FIG. 16C is a second embodiment with a two-layer coating.
FIG. 16D is a first embodiment with a three-layer coating.
FIG. 16E is a second embodiment with a three-layer coating.
FIG. 16F is a third embodiment with a three-layer coating.
FIG. 16G is a fourth embodiment with a three-layer coating.
FIG. 16H is a fifth embodiment with a three-layer coating.
FIG. 16I is an axial view of a first embodiment with a single-layer coating. FIG. 16J is an axial view of a second embodiment with a single-layer coating. FIG. 16K is an axial view of an embodiment with a two-layer coating. FIG. 16L is an axial view of an embodiment with a three-layer coating.

FIG. 17B is a first diagram, FIG. 17C is a second diagram, FIG. 17D is a third diagram, and FIG. 17E is a fourth diagram.

FIGS. 19A-19D is an illustration of one method for practicing the method of FIG. 18, in accordance with some embodiments. FIG. 19A is a first diagram, FIG. 19B is a second diagram, FIG. 19C is a third diagram, and FIG. 19D is a fourth diagram.

FIG. 20A is a top perspective view of the membrane stretching device. FIG. 20B is a bottom perspective view of the membrane stretching device.

FIG. 21A is a first diagram, FIG. 21B is a second diagram, FIG. 21C is a third diagram, and FIG. 21D is a fourth diagram.

FIG. 22A is a first diagram, FIG. 22B is a second diagram, and FIG. 22C is a third diagram.

DETAILED DESCRIPTION

Figure 1:
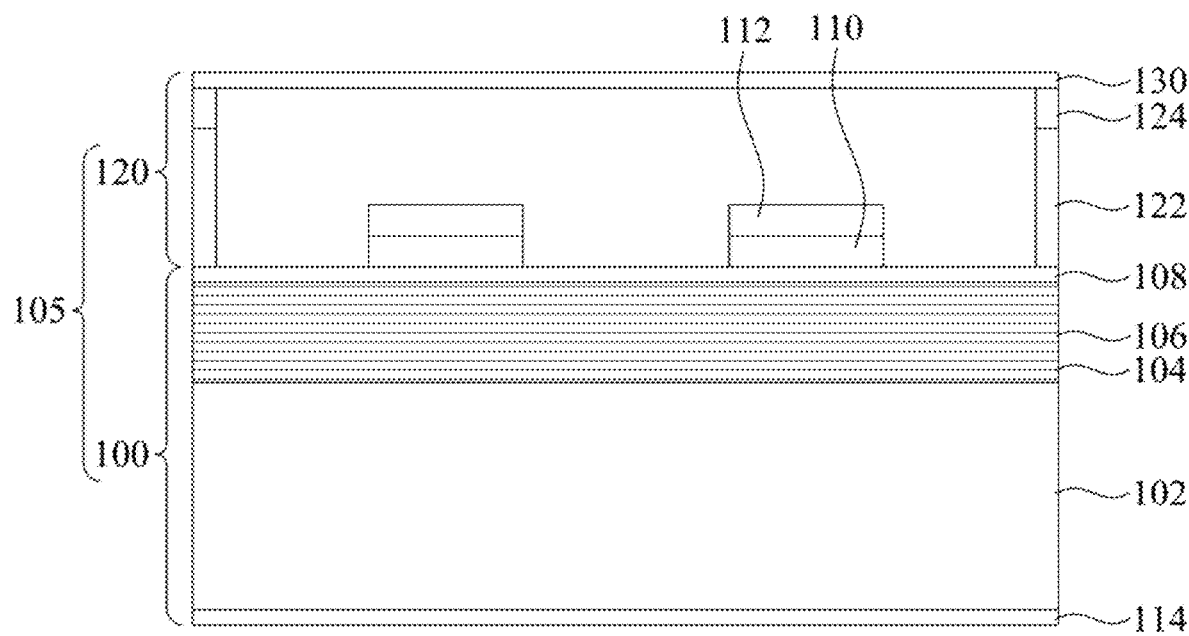
FIG. 1 is a cross-sectional view of an example reticle and pellicle assembly, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to the temperature at which the heat source is set, and do not specifically refer to the temperature which must be attained by a particular material being exposed to the heat.

Photolithographic patterning processes use a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The exposed portion of the photoresist is photochemically modified. After the exposure, the resist is developed to define openings in the resist, and one or more semiconductor processing steps (e.g. etching, epitaxial layer deposition, metallization, et cetera) are performed which operate on those areas of the wafer surface exposed by the openings in the resist. After this semiconductor processing, the resist is removed by a suitable resist stripper or the like.

The minimum feature size of the pattern is limited by the light wavelength. Deep ultraviolet (UV) lithography, for example using a wavelength of 193 nm or 248 nm in some standard deep UV platforms, typically employs transmission masks and provides a smaller minimum feature size than lithography at longer wavelengths. Extreme ultraviolet (EUV) light, which spans wavelengths from 124 nanometers (nm) down to 10 nm, is currently being used to provide even smaller minimum feature size. At shorter wavelengths, particle contaminants on the reticle can cause defects in the transferred pattern. Thus, a pellicle assembly (or simply pellicle) is used to protect the reticle from such particles. The pellicle assembly includes a pellicle membrane which is attached to a mounting frame. The mounting frame supports the pellicle membrane over the reticle. Any contaminating particles which land on the pellicle membrane are thus kept out of the focal plane of the reticle, thus reducing or preventing defects in the transferred pattern.

FIG. 1 illustrates a cross-sectional view of an example reticle assembly 105 useful in lithography, according to some embodiments. The reticle assembly 105 includes a reticle 100 and a pellicle assembly 120. The illustrative reticle 100 (also referred to in the art as a mask, photomask, or similar phraseology) is a reflective mask of a type commonly used in EUV lithography, and includes a substrate 102, alternating reflective layers 104 and spacing layers 106, a capping layer 108, an EUV absorbing layer 110 that is patterned to define a mask pattern, an anti-reflective coating (ARC) 112, and a conductive backside layer 114. The illustrative reticle 100 is merely a nonlimiting example. More generally, pellicles as disclosed herein can be used with substantially any type of reflective or transmission reticle. As another example (not shown), the reticle may be a transmission reticle, in which case the substrate is transmissive for light at the wavelength at which the lithography is performed. In general, the reflective or transmissive reticle includes a substrate (e.g. substrate 102) and a mask pattern (e.g. absorbing layer 110) disposed on the substrate. As illustrated here, the pellicle assembly 120 includes a mounting frame 122, an adhesive layer 124, and a pellicle membrane 130. In some non-limiting illustrative embodiments, the reticle and pellicle assembly are intended for use with EUV light wavelengths, for example from 124 nm to 10 nm, including about 13.5 nm.

In embodiments, the substrate 102 is made from a low thermal expansion material (LTEM), such as quartz or titania silicate glasses available from Corning under the trademark ULE. This reduces or prevents warping of the reticle due to absorption of energy and consequent heating. The reflective layers 104 and the spacing layers 106 cooperate to form a Bragg reflector for reflecting EUV light. In some embodiments, the reflective layers may comprise molybdenum (Mo). In some embodiments, the spacing layers may comprise silicon (Si). The capping layer 108 is used to protect the reflector formed from the reflective layers and the spacing layers, for example from oxidation. In some embodiments, the capping layer comprises ruthenium (Ru). The EUV absorbing layer 110 absorbs EUV wavelengths, and is patterned with the desired pattern. In some embodiments, the EUV absorbing layer comprises tantalum boron nitride. The anti-reflective coating (ARC) 112 further reduces reflection from the EUV absorbing layer. In some embodiments, the anti-reflective coating comprises oxidized tantalum boron nitride. The conductive backside layer 114 permits mounting of the illustrative reticle on an electrostatic chuck and temperature regulation of the mounted substrate 102. In some embodiments, the conductive backside layer comprises chrome nitride.

The mounting frame 122 supports the pellicle membrane at a height sufficient to take the pellicle membrane 130 outside the focal plane of the lithography, e.g., several millimeters (mm) over the reticle in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 124 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

The pellicle membrane 130 is usually stretched over the mounting frame to obtain a uniform and flat surface. However, sagging of the pellicle membrane can occur, causing the membrane to deflect significantly from the desired flat and uniform orientation. This deflection can affect the light that is being reflected from the reticle and the resulting transferred pattern.

In addition, reticles (and their protective pellicle assembly) are maintained in reticle pods for safety and protection during lithographic patterning and other processes. Current EUV lithography systems typically use a dual-pod configuration consisting of an inner metal pod under vacuum and an outer pod with access to the ambient environment. The inner pod is only opened when the pod is inside the tool. Pressure differences, gravity, and other external forces can cause the pellicle membrane to deflect or sag. If the pellicle membrane sags far enough to contact the inner surface of the inner metal pod in which the reticle is kept, contamination of the pellicle membrane can occur, or the pellicle membrane itself might break.

The present disclosure thus relates to pellicle membranes and methods for producing pellicle membranes that are intended to reduce deflection of the pellicle membrane while maintaining high transmittance of EUV light and the particle-protecting ability of the pellicle membrane. In particular, the pellicle membranes contain at least one layer made from nanotube bundles, such that the nanotube bundles have a minimum specified diameter. Such pellicle membranes have improved mechanical properties compared to those made with shorter nanotubes, in particular reduced deflection.

In some embodiments, the pellicle membrane is a single-layer structure. In other embodiments, the pellicle membrane is a multi-layer structure. In some embodiments, the layers of the multi-layer structure can be made of the same materials, and in other embodiments the layers of the multi-layer structure can be made of different materials selected for particular purposes and arranged in order as desired. For example, in some embodiments, the pellicle membrane may comprise one or more nanotube membrane layers and one or more graphene membrane layers.

The pellicle membrane can be attached to a border or to a suitably shaped mounting frame for mounting to the reticle. In some embodiments, a conformal coating is applied to the outer surface of the pellicle membrane (which can be a single layer or a multi-layer structure), either before or after attachment. The resulting pellicle assembly can then be mounted onto a reticle.

A combination of several low-density membrane layers can be used to obtain a pellicle membrane that has a combination of high transmittance, small pore size and a stiffness which minimizes any potential deflection.

In particular embodiments, the nanotube layer is formed from thick nanotube bundles, which if desired can be combined with other layers formed from thin nanotube bundles.

A thick nanotube bundle is formed from more than 20 individual nanotubes wrapped around each other. While there is no theoretical limit, in particular embodiments a thick nanotube bundle may be formed from a maximum of about 100 nanotubes. In more specific embodiments, a thick nanotube bundle is formed from at least 25 nanotubes, including from 25 to about 100 nanotubes, which are tangled together. It has been discovered that thicker nanotube bundle layers are stiffer and minimize deflection, and also have a longer service lifetime. A thick nanotube bundle generally has a diameter of 25 nanometers or greater, and in various embodiments may have a diameter of up to about 50 nm. In this regard, bundles with smaller diameters, particular 16 nm or less, will be damaged more quickly due to hydrogen attack which can occur due to EUV exposure.

By way of contrast, a thin nanotube bundle is formed from one to 20 individual nanotubes, which are tangled together. In more specific embodiments, a thin nanotube bundle is formed from one to 14 nanotubes which are tangled together. It is noted that an individual nanotube may be a single-walled nanotube or a multi-walled nanotube. The walls of a multi-walled nanotube are arranged concentrically, not helically, and a multi-walled nanotube itself should not be considered a nanotube bundle. A thin nanotube bundle generally has a diameter of about 4 nm to about 20 nanometers.

It is noted that when large numbers of nanotube bundles are discussed, reference is made to the average diameter of the nanotube bundles. Put another way, thick nanotube bundles have an average diameter of greater than 25 nanometers, and thin nanotube bundles have an average diameter up to about 20 nanometers.

A multi-layer pellicle membrane can be formed from any number of layers, and in any combination. FIGS. 2A-2E are different views of illustrative embodiments of a multi-layer pellicle membrane. In these figures, a conformal coating is not applied.

Figure 2A:
FIGS. 2A-2E are side views of different embodiments of a multi-layer pellicle membrane.

FIG. 2A depicts a side view of a first embodiment of a pellicle membrane 130 formed from two different layers. The top layer is a thin nanotube bundle layer 140, and the bottom layer is a thick nanotube bundle layer 150. The thin nanotube bundle layer is formed from thin nanotube bundles. The thick nanotube bundle layer is formed from thick nanotube bundles.

Figure 2B:
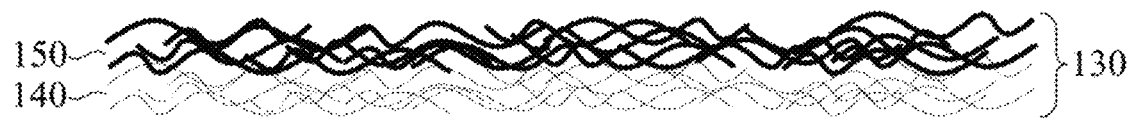

FIG. 2B depicts a side view of a second embodiment of a pellicle membrane 130 formed from two different layers. Here, the top layer is a thick nanotube bundle layer 150, and the bottom layer is a thin nanotube bundle layer 140.

Figure 2C:
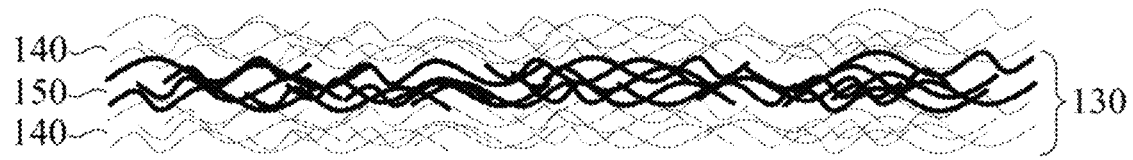

FIG. 2C depicts a side view of a third embodiment of a pellicle membrane 130 formed from three different layers. The top layer is a first thin nanotube bundle layer 140, the middle layer is a thick nanotube bundle layer 150, and the bottom layer is a second thin nanotube bundle layer 140.

Figure 2D:
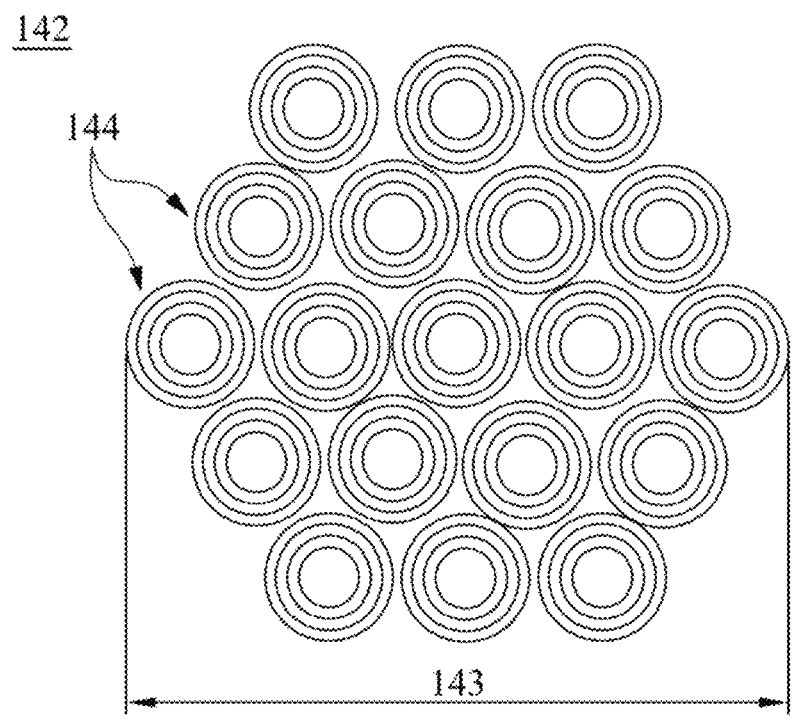

FIG. 2D is an axial view of one embodiment of a thin bundle 142 of nanotubes, which can be used in making a thin nanotube bundle layer. As illustrated here, the thin bundle is formed from a combination of 19 different multi-wall nanotubes 144. The thin bundle has a diameter 143 of about 20 nm. A thick nanotube bundle is very similar, but contains more nanotubes.

Figure 2E:
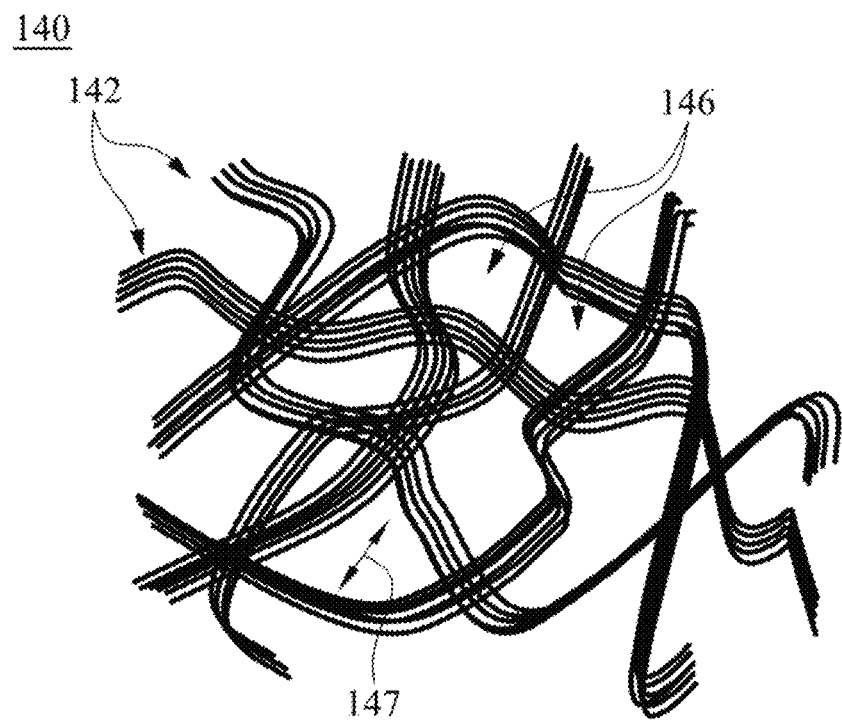

FIG. 2E is a plan view of one embodiment of a thin nanotube bundle layer 140. As seen here, multiple thin nanotube bundles 142 are made of individual nanotubes which are tangled together. Pores 146 are present between the entangled bundles 142. In embodiments, the pores of the nanotube bundle layers have an average diameter 147 of about 1 nanometer to about 100 nanometers. The average diameter is the diameter of a circle that will obtain an area equal to the average area of all pores (which may be irregularly shaped) in the nanotube bundle layer. Again, a thick nanotube bundle is similar, and will also have pores with an average diameter of about 1 nanometer to about 100 nanometers. It is noted that the pores of a thick nanotube bundle layer will always have a greater average diameter than the pores of a thin nanotube bundle layer.

Figure 3:
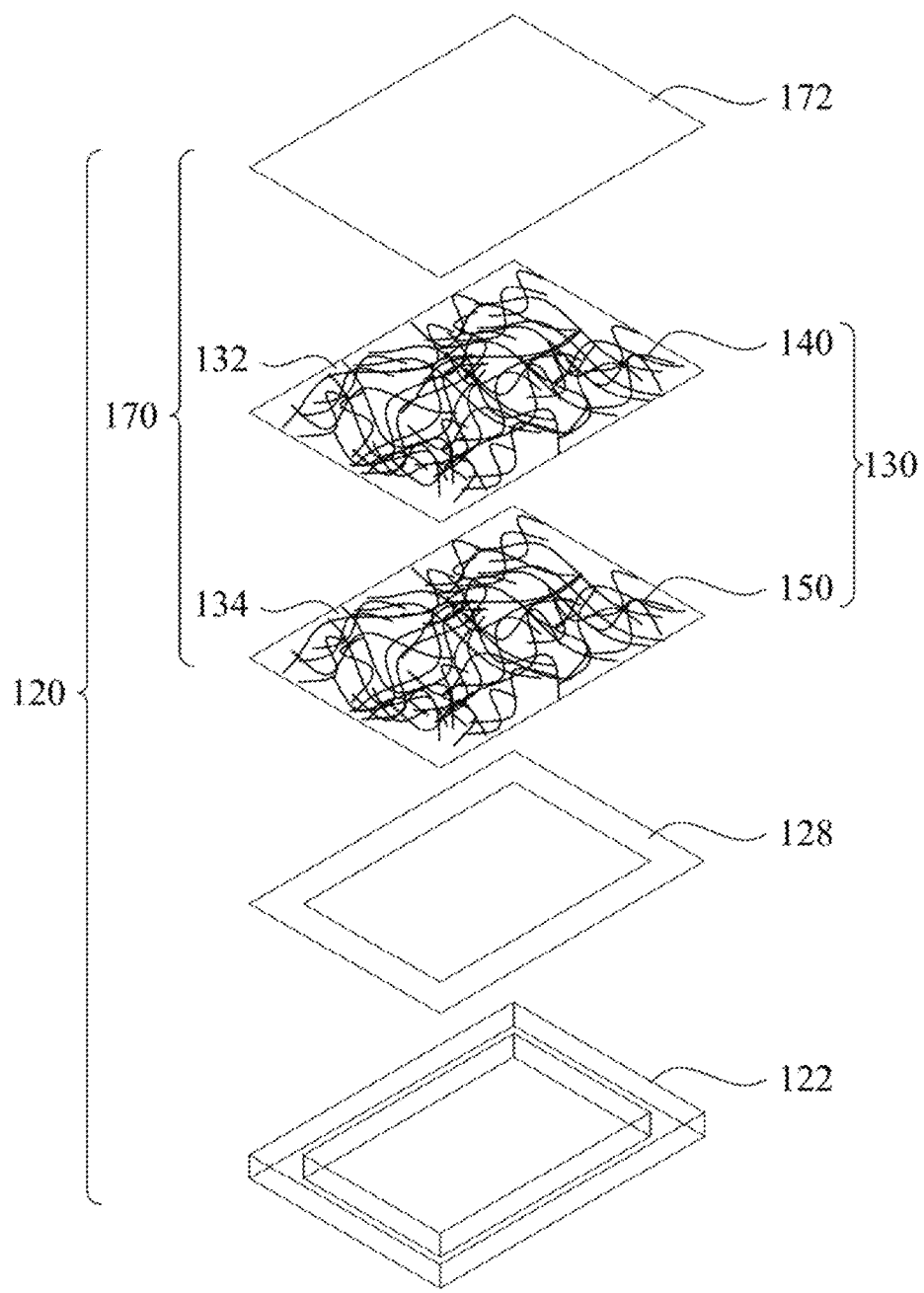
FIG. 3 is an exploded view of a first embodiment of a pellicle membrane, pellicle membrane assembly, and pellicle assembly in accordance with some embodiments.
Figure 4:
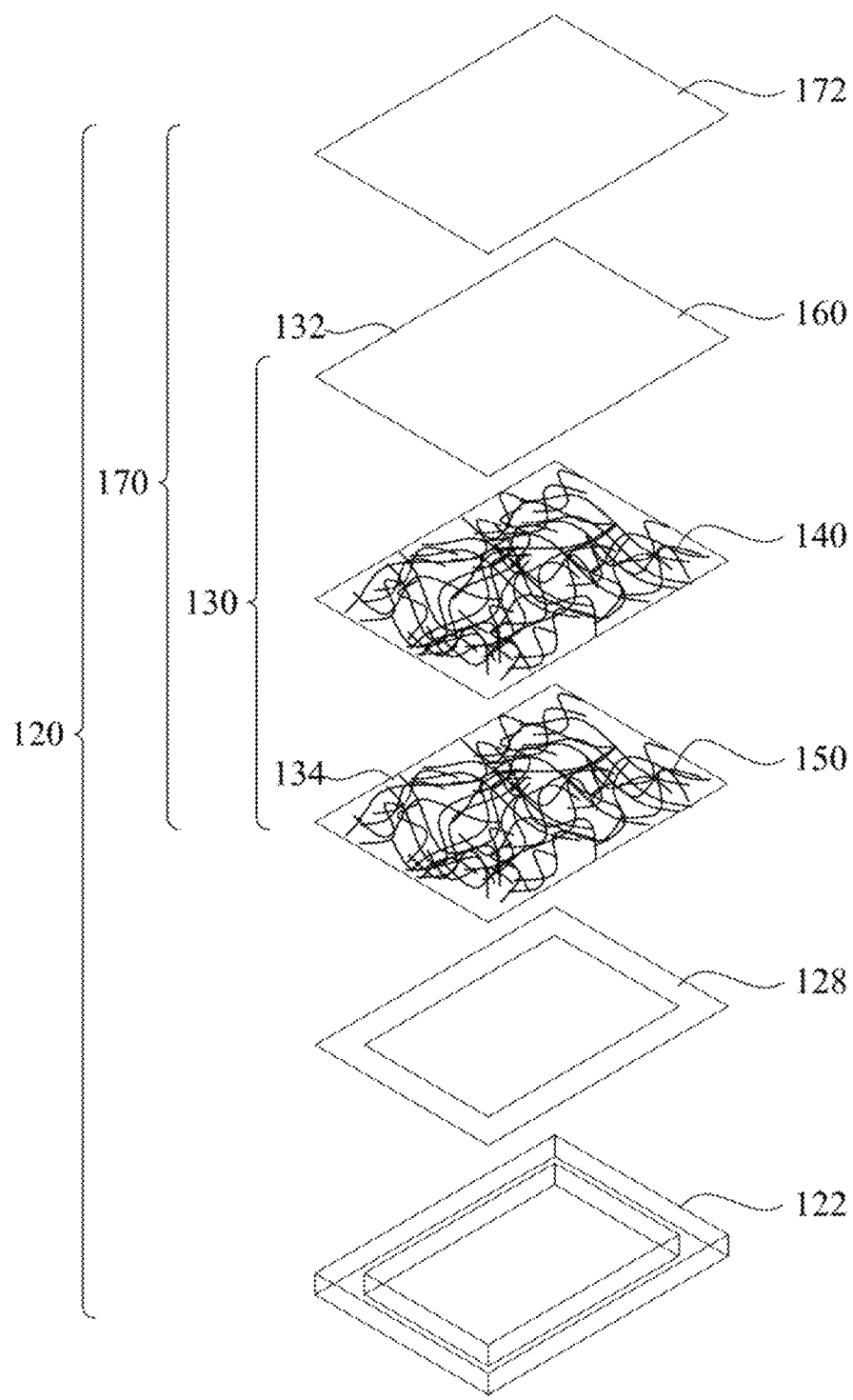
FIG. 4 is an exploded view of a second embodiment of a pellicle membrane, pellicle membrane assembly, and pellicle assembly in accordance with some embodiments.
Figure 5:
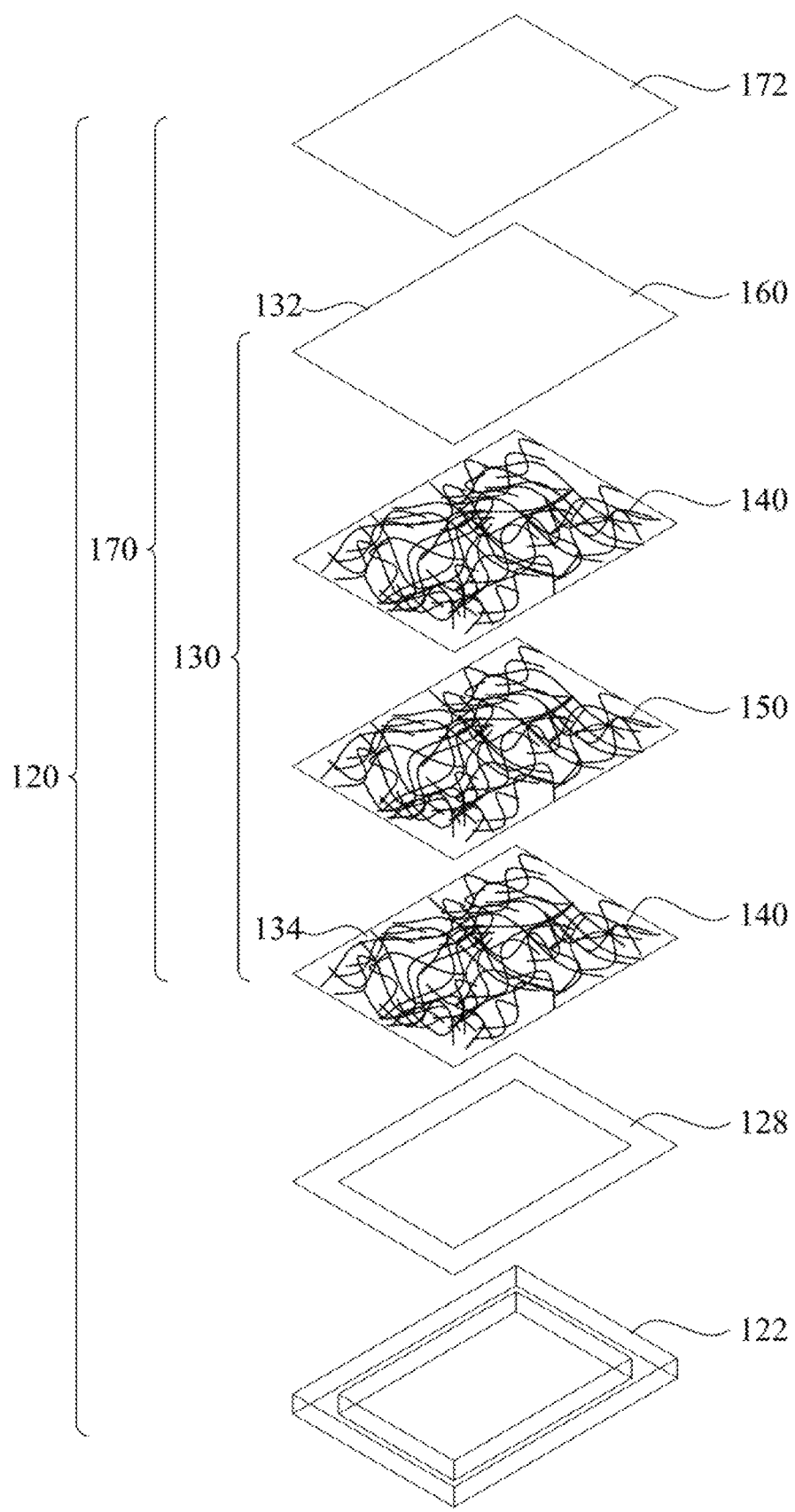
FIG. 5 is an exploded view of a third embodiment of a pellicle membrane, pellicle membrane assembly, and pellicle assembly in accordance with some embodiments.

Continuing, FIGS. 3-5 show different embodiments of a pellicle membrane 130, pellicle membrane assembly 170, and pellicle assembly 120 according to the present disclosure. In these embodiments, a conformal coating is present.

In the first embodiment of FIG. 3, the pellicle membrane 130 is a multi-layer structure formed from a thin nanotube bundle layer 140 and a thick nanotube bundle layer 150. Each layer may also be referred to as a nanotube layer or as a membrane layer. The two layers contact each other via van der Waals forces, and the nanotube bundles in each layer do not become entangled with the other layer. In some embodiments, each nanotube layer has a thickness of about 10 nm to about 100 nm.

Here, the thin nanotube bundle layer is also considered the outer surface 132 of the pellicle membrane, to which a conformal coating is applied. For easier visualization, the conformal coating is also illustrated here as a separate layer 172 of the pellicle membrane. In some embodiments, the coating has a thickness of about 0.5 nanometer (nm) to about 10 nm. The conformal coating may also be present on the other surfaces of the pellicle membrane, as will be illustrated further herein.

The thick nanotube bundle layer is also considered the inner surface 134 of the pellicle membrane and is attached to a border 128. The border runs along the perimeter of the pellicle membrane. The border is also attached to a mounting frame 122.

The combination of the conformal coating 172 and the pellicle membrane 130 together is referred to as a pellicle membrane assembly 170 herein. The combination of the pellicle membrane assembly 170, border 128, and mounting frame 122 is referred to herein as a pellicle assembly 120.

FIG. 4 is an exploded view of a second embodiment of a pellicle membrane 130, pellicle membrane assembly 170, and pellicle assembly 120 according to the present disclosure. Here, the pellicle membrane is a multi-layer structure formed from a graphene membrane layer 160, a thick nanotube bundle layer 150, and a thin nanotube bundle layer 140. The graphene membrane layer is also considered the outer surface 132 of the pellicle membrane. The graphene membrane layer may be, in some embodiments, a porous film or a continuous film without pores. The thin nanotube bundle layer is also considered the inner surface 134 of the pellicle membrane and is attached to the border 128. In some embodiments, the graphene membrane layer 160, the thin nanotube bundle layer 140, and the thick nanotube bundle layer 150 directly contact each other.

FIG. 5 is an exploded view of a third embodiment of a pellicle membrane 130, pellicle membrane assembly 170, and pellicle assembly 120 according to the present disclosure. Here, the pellicle membrane is a multi-layer structure formed from two thin nanotube bundle layers 140 which contact opposite surfaces of a thick nanotube bundle layer 150. Put another way, the thick nanotube bundle layer is a core layer of the pellicle membrane, and the two thin nanotube bundle layers are outer layers of the pellicle membrane. Alternatively, the thick nanotube bundle layer is sandwiched between the two thin nanotube bundle layers.

It is contemplated that the thick nanotube bundle layer will provide mechanical control for the overall pellicle membrane. However, the pores of a thick nanotube bundle layer are larger than the pores of a thin nanotube bundle layer. The thin nanotube bundle layer provides control over the pore size of the overall pellicle membrane, such that particles cannot penetrate the pellicle membrane and fall onto the reticle. In addition, the thin nanotube bundle layer may act as a sacrificial layer for the thick nanotube bundle layer. In this regard, it is believed that even if the thin nanotube bundles rupture due to hydrogen damage, their remains will still serve to reduce the pore size of the thick nanotube bundle layer, thus increasing the service lifetime of the multi-layer pellicle membrane.

In some different embodiments not illustrated, the graphene membrane layer 160 forms the inner surface 134 of the pellicle membrane and is attached to the border 128. Alternatively, the graphene membrane layer 160 can be located between any two nanotube membrane layers. One of the nanotube bundle layers would be considered the outer surface 132 of the pellicle membrane. Continuing, both nanotube bundle layers/membrane layers can be formed from randomly oriented nanotubes or directionally oriented nanotubes, and contact each other. The locations of the thin nanotube bundle layer and the thick nanotube bundle layer within the pellicle membrane can also be switched, such that either layer can be considered the outer surface of the pellicle membrane.

FIGS. 6A-6D are side views showing four different embodiments of a pellicle assembly attached to an EUV reticle. They differ from each other based on whether the pellicle membrane is attached to a mounting frame or a border, and on how the various components of the pellicle assembly are attached to each other.

Figure 6A:
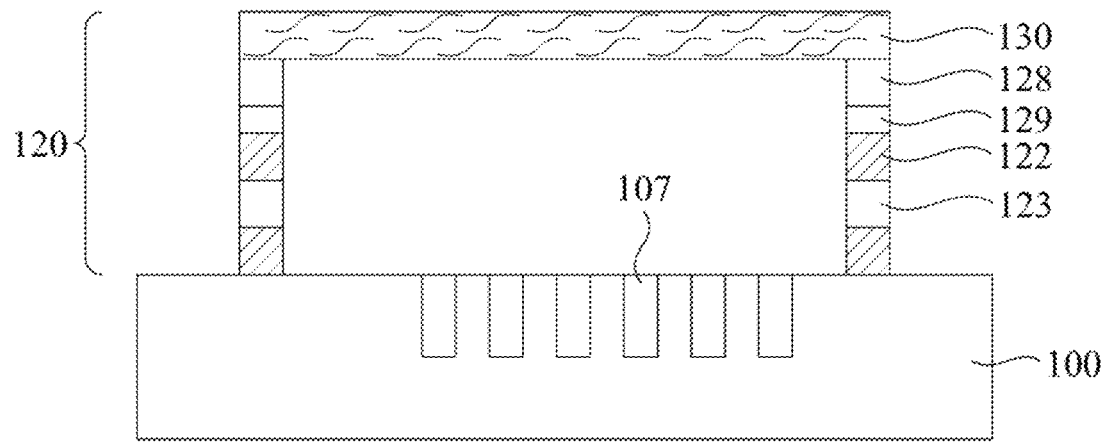
FIG. 6A-6D are side views of different embodiments of a pellicle assembly attached to an EUV reticle.

As illustrated in the first embodiment of FIG. 6A, the EUV reticle 100 includes a patterned image 107. The pellicle assembly 120 includes the pellicle membrane 130 which is attached to border 128 via van der Waals forces. The border 128 is joined to the mounting frame 122 via adhesive layer 129 and protects the patterned image 107 from particle contaminants. As seen here, the mounting frame 122 can include vent holes 123. The mounting frame 122 is joined to the reticle 100 via a mechanical attachment.

Figure 6B:
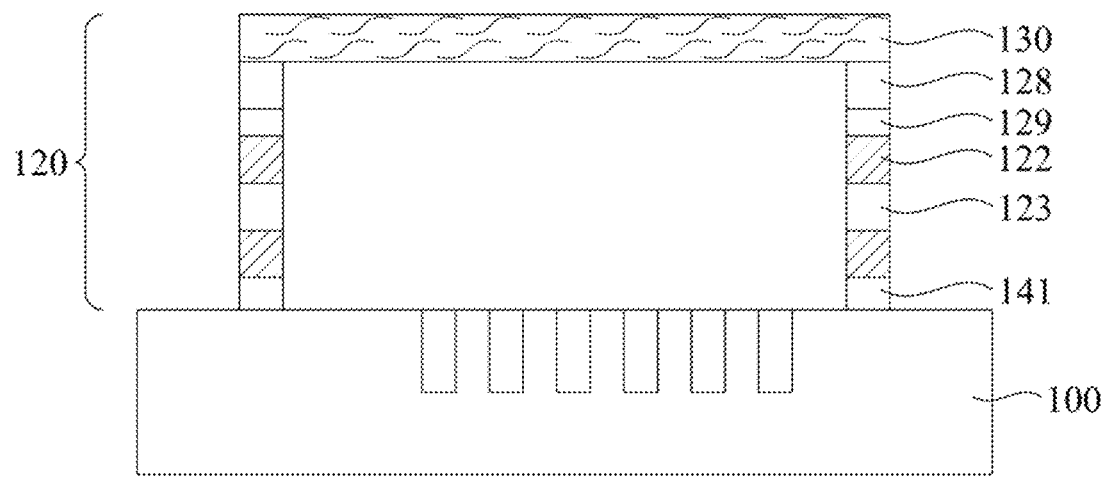

In the second embodiment of FIG. 6B, the pellicle membrane 130 is attached to border 128 via van der Waals forces. The border 128 is joined to the mounting frame 122 via a first adhesive layer 129. The mounting frame 122 is joined to the reticle 100 via a second adhesive layer 141.

Figure 6C:
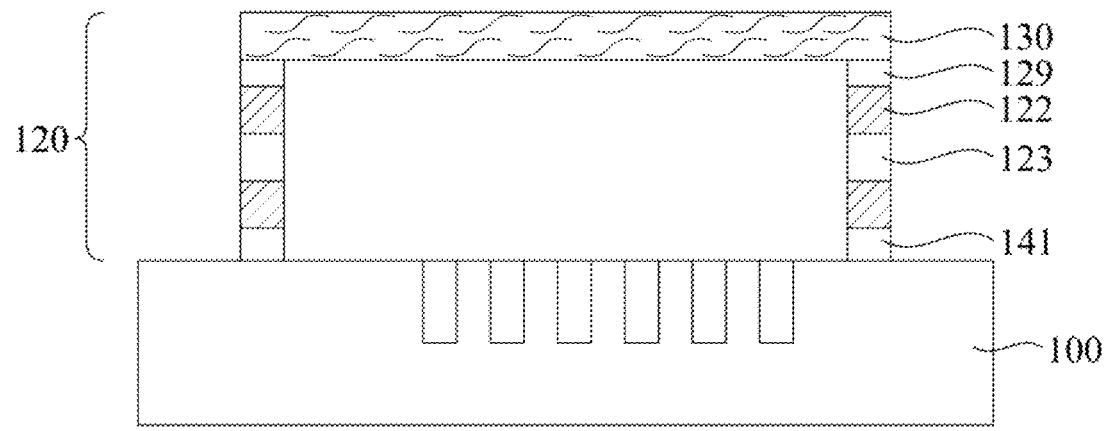

In the third embodiment of FIG. 6C, the pellicle membrane 130 is attached to the mounting frame 122 via a first adhesive layer 129. The mounting frame 122 is joined to the reticle 100 via a second adhesive layer 141.

Figure 6D:
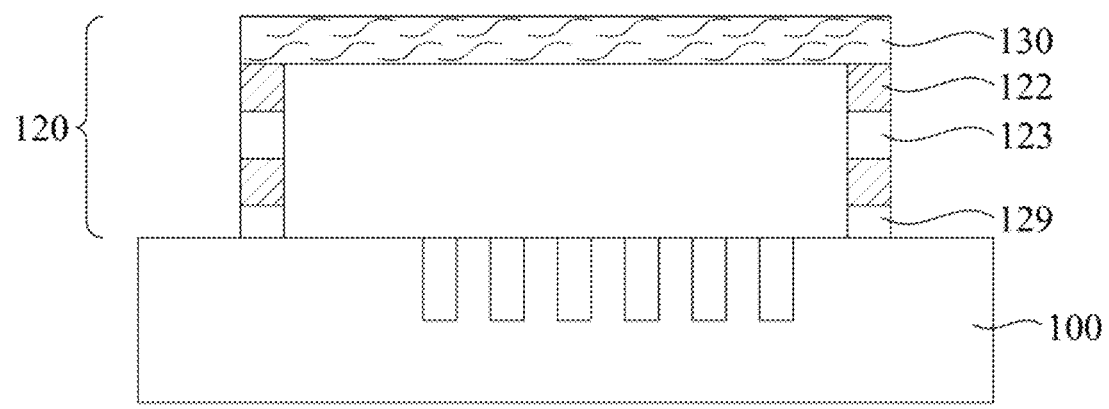

In the fourth embodiment of FIG. 6D, the pellicle membrane 130 is directly attached to mounting frame 122 via van der Waals forces. The mounting frame 122 is joined to the reticle 100 via a first adhesive layer 129.

Figure 7A:
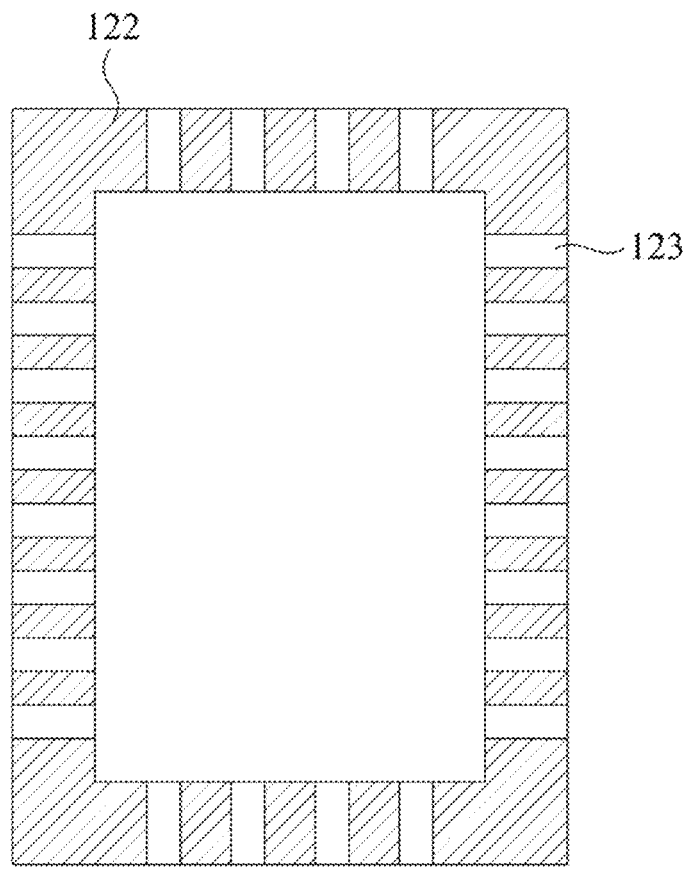
FIGS. 7A-7C are different views of a mounting frame, in accordance with some embodiments.
Figure 7B:
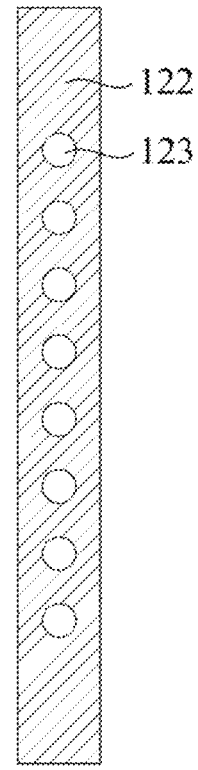
Figure 7C:
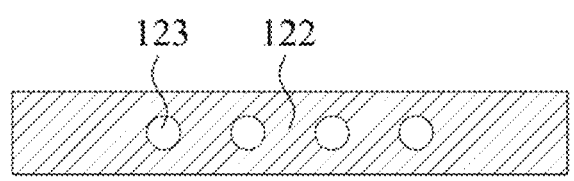

FIGS. 7A-7C are different views of the mounting frame 122, according to some embodiments of the present disclosure. FIG. 7A is a plan cross-sectional view in which the plane cuts through the vent holes 123, FIG. 7B is a first side view, and FIG. 7C is a front side view. Vent holes 123 are visible on all sides of the mounting frame. However, it is contemplated that vent holes may be present on only one, two, or three sides of the mounting frame.

Both the border and the mounting frame can each be made from suitable materials such as anodized aluminum, stainless steel, plastic, silicon (Si), titanium, silicon dioxide, aluminum oxide ($Al_2O_3$), or titanium dioxide ($TiO_2$). As seen here, vent holes 123 may be present in the mounting frame 122 for equalizing pressure on both sides of the pellicle membrane. In some embodiments, the total area of the vent holes can range from zero to about 100 square millimeters ($mm^2$). It is noted that the pellicle membrane itself is relatively porous, and thus can provide the venting function itself. The vent holes can be spaced apart from each other as desired.

As described above, one or more layers of the pellicle membrane are formed from nanotubes. In some embodiments, the nanotubes can be carbon nanotubes (CNTs) or boron nitride nanotubes (BNNTs) or silicon carbide nanotubes (SiCNTs) or molybdenum disulfide nanotubes ($MoS_2NTs$) or molybdenum diselenide ($MoSe_2NTs$) or tungsten disulfide nanotubes ($WS_2NTs$) or tungsten diselenide nanotubes ($WSe_2NTs$). In some embodiments, the nanotubes can be single-wall nanotubes or multi-wall nanotubes. It is possible for the individual nanotubes that make up a multi-wall nanotube to be made of different materials, for example a CNT inside a BNNT, or vice versa. In some embodiments, the nanotubes can be metallic or semiconducting or electrically insulating. The diameter of the individual nanotubes is not significant. In some embodiments, the length of the individual nanotubes may be from about 1,000 μm to about 6 centimeters (cm).

The nanotubes may have different properties. For example, carbon nanotubes can have a Young's modulus of about 1.33 TPa; a maximum tensile strength of about 100 GPa; thermal conductivity of about 3,000 to about 40,000 W/m K; and be stable up to a temperature of about 400° C. in air. Boron nitride nanotubes can have a Young's modulus of about 1.18 TPa; a maximum tensile strength of about 30 GPa; thermal conductivity of about 3000 W/m K; and be stable up to a temperature of about 800° C. in air.

Generally, the nanotubes of each nanotube membrane layer can be randomly oriented or can be directionally oriented in a desired direction. The nanotube membrane layer(s), whether randomly oriented or directionally oriented, can be combined as desired. In some embodiments, the nanotube membrane layer(s) in the pellicle membrane are all randomly oriented. In some embodiments, the nanotube membrane layer(s) in the pellicle membrane are all directionally oriented. In these embodiments, the directionally oriented nanotube membrane layers are aligned at an angle relative to each other. That angle can be any angle between 0° and 180°, and for example may be 0°, 30°, 45°, 60°, 75°, 90°, 120°, 135°, 145°. 160°, or 180°.

In addition, in some embodiments, one or more layers of the pellicle membrane are formed from graphene or graphite. Such layers can provide more stiffness compared to layers formed from nanotubes. Graphite is made up of stacked graphene layers, and thus should be considered equivalent to graphene in this disclosure. In contrast to the nanotubes, graphene and graphite are in the shape of flat sheets or porous sheets. Graphene has a Young's modulus of approximately 1,000 GPa.

In some embodiments, the nanotube membrane layer(s), the graphene membrane layer(s), and the resulting pellicle membrane generally should not include any other materials. For example, the membranes should not contain any moisture or any other binders, metals, plastics, surfactants, acids, or other compounds that might have been present in precursor materials or used in prior processing steps. In some embodiments, each individual nanotube membrane layer can have a thickness ranging from about 10 nanometers (nm) to about 100 nm, although thicknesses outside this range are also contemplated. In some embodiments, each individual graphene membrane layer can have a thickness ranging from about 1 nm to about 10 nm, although thicknesses outside this range are also contemplated.

Figure 8:
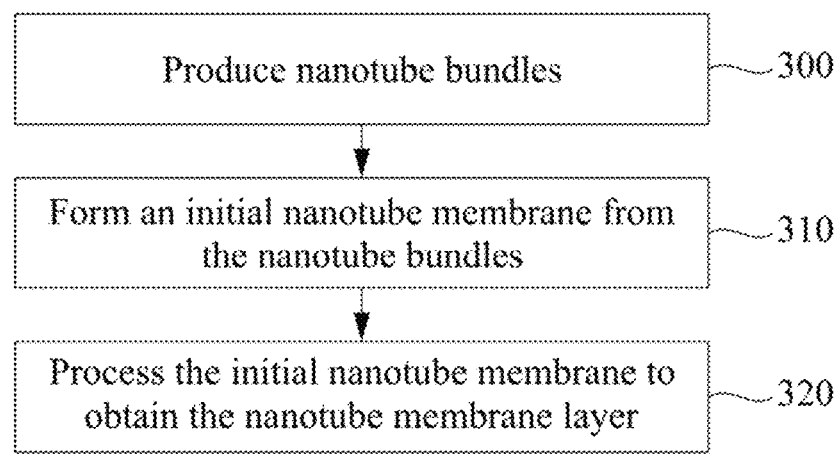
FIG. 8 is a flow chart illustrating a method for preparing a nanotube membrane layer, in accordance with some embodiments.

FIG. 8 is a flow chart illustrating some embodiments of methods for preparing a nanotube membrane layer. In step 300, nanotube bundles made from individual nanotubes, such as carbon nanotubes or boron nitride nanotubes, are produced. Nanotube bundles can be formed using conventional processes. Next, in step 310, an initial nanotube membrane is formed from the nanotube bundles. In some embodiments, this is done by arranging the bundles next to each other. Without being bound by theory, it is believed that the bundles are held together by van der Waals forces of sufficient strength to form the initial nanotube membrane. The initial nanotube membrane can be annealed. The annealing may occur at temperatures of about 1000° C. to about 2000° C. Finally, in step 320, the initial nanotube membrane is processed to reduce its thickness and obtain the nanotube membrane layer. This can be done as previously described, for example by compression or immersion in solution.

The nanotube membrane layer(s) and the graphene membrane layer(s) can be formed using several different fabrication processes. For example, such fabrication processes can include chemical vapor deposition (CVD) such as floating catalyst CVD or plasma-enhanced CVD; electrophoretic deposition; dispersal in a solution and concentration by removal of the solvent; vacuum filtration; and the like.

In some embodiments, nanotubes can be produced using water assisted, catalytic CVD. Generally, the nanotubes are produced in a reactor vessel, such as a 2-inch quartz reactor tube. The reactor vessel may be equipped with a heat source along its length in order to maintain a specified temperature inside the vessel. The temperature inside the vessel may range from about 500° C. to about 1000° C. Gaseous reactants, water, and a catalyst are introduced into the reaction vessel to grow the nanotubes. In some embodiments, the gaseous reactants may include argon, hydrogen, and/or ethylene. The partial pressure of argon may range from about 500 mmHg to about 600 mmHg. The partial pressure of hydrogen may range from about 10 mmHg to about 100 mmHg. The partial pressure of ethylene (as a carbon source) may range from about 50 mmHg to about 250 mmHg. The concentration of water within the reactor may range from zero to about 1000 ppm, or from about 200 ppm to about 700 ppm. In some embodiments, the catalyst may be an Iron-Gadolinium (Fe—Gd) alloy film, or another Fe-Lanthanide element alloy. Generally, lanthanide elements enhance the growth rate of nanotubes when used with a Fe catalyst.

In other embodiments, the nanotubes can be formed by direct spinning nanotubes from a floating catalyst CVD system. The direct spinning process begins by providing a reactor vessel. The reactor vessel may have a length of greater than five meters for an increased growth path, but can also be shorter. The reactor vessel may also be equipped with a heat source to ensure a specified temperature in the reactor vessel. The temperature inside the vessel may range from about 500° C. to about 1300° C. Usually ferrocene is introduced into the reactor vessel as both a carbon source and an iron catalyst along with hydrogen and sulfur (e.g. in the form of thiophene). Nanotubes are then grown in the vessel and form an aerogel that is then capable of being spun into a fiber.

In this regard, sulfur acts as a catalyst to improve the growth of the nanotubes. Sulfur acts as a promoter to enhance the addition of carbon atoms to the growing ends of graphene tubes. Sulfur also acts as a surfactant to encourage tube nucleation and thus prevent carbon encapsulation of the catalyst particle. Additionally, sulfur limits the rate at which the iron particles coarsen by collision. Further, sulphur prevents iron that is deposited on the reactor wall from nucleating and growing nanotubes.

Figure 9:
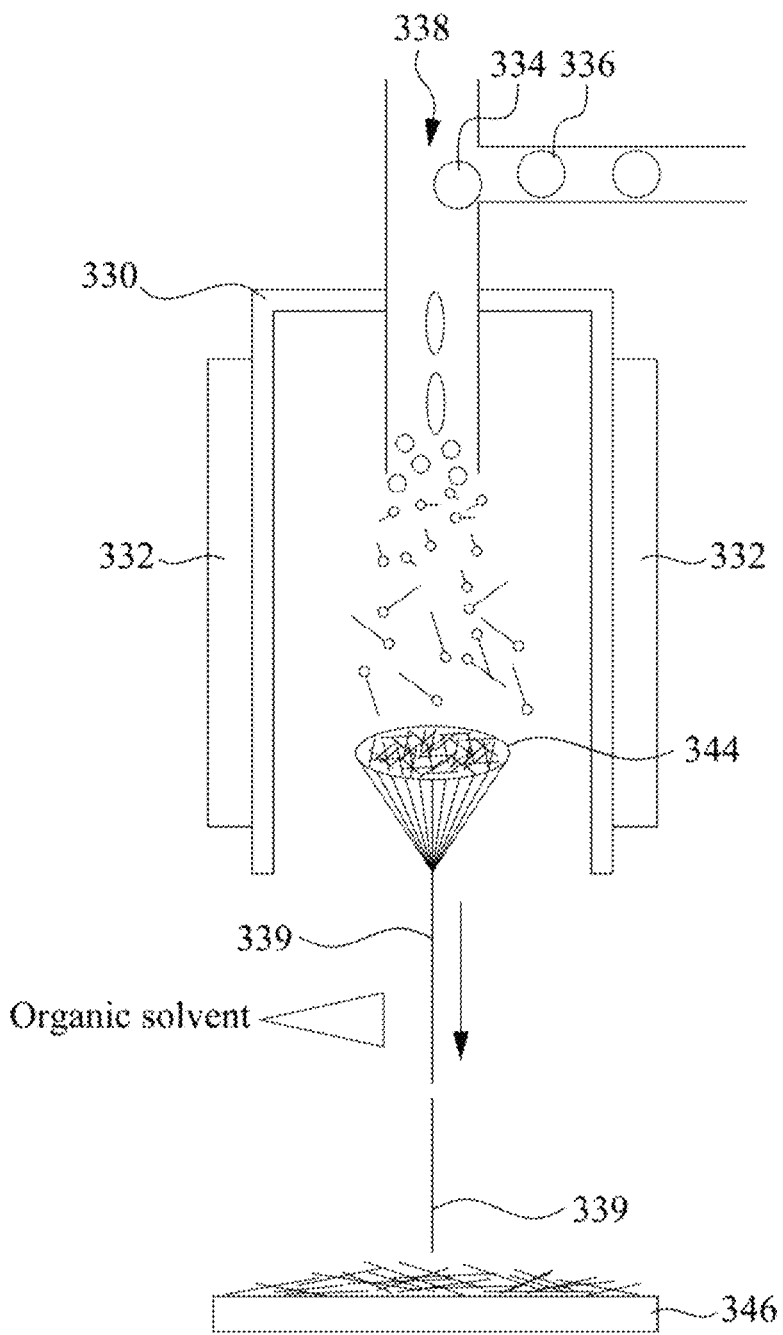
FIG. 9 is a diagram illustrating a first embodiment of the method of FIG. 8, in accordance with some embodiments.

FIG. 9 is a drawing illustrating a first embodiment of steps 300 and 310 of the method of FIG. 8. A reaction vessel 330 is illustrated, with a heat source 332 for heating materials passing through the reaction vessel. Reactants 334, catalyst 336, and carrier gas 338 enter the reaction vessel. Nucleation, growth, and aggregation of nanotubes in the form of an aerogel 344 occur, and the aerogel is then spun into bundles 339 of nanotubes. In some embodiments, this process occurs at temperatures of about 1100° C. to about 1300° C. This results in the nanotubes being directionally oriented (i.e., oriented in the same direction). An organic solvent is used for densification of the fibers. In some embodiments, the organic solvent can be acetone or an alcohol such as isopropyl alcohol. The nanotube bundles 339 are then deposited onto a treated filter paper or polymer 346. Sucking pressure is applied to the treated filter paper 346, and the treated filter paper 346 is rotated to ensure uniform dispersion and obtain an initial nanotube membrane.

Figure 10:
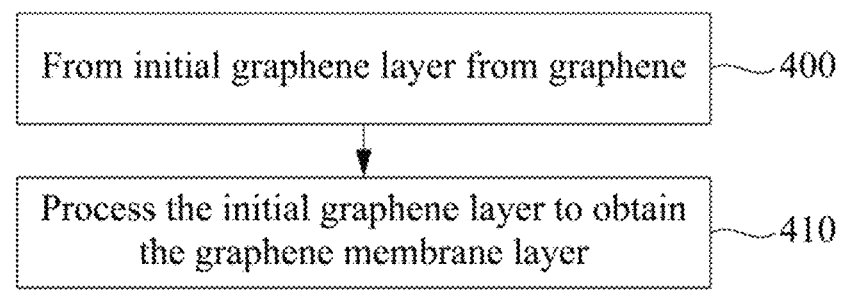
FIG. 10 is a flow chart illustrating a method for preparing a graphene membrane layer, in accordance with some embodiments.

FIG. 10 is a flow chart illustrating one embodiment of a method for preparing a graphene membrane layer (which can be used in a multi-layer pellicle membrane). In step 400, an initial graphene layer is formed by dispersing relatively small graphene flakes or sheets on a surface to obtain a relatively large initial membrane. The smaller flakes or sheets can be arranged so that pores of a desired size are present between the smaller flakes/sheets. It is noted that this initial membrane can fall apart easily, since the individual flakes/sheets are not strongly bound to each other. Finally, in step 410, the initial graphene layer is processed to reduce its thickness and obtain the graphene membrane layer. In some embodiments, the thickness is reduced by applying compressive pressure (e.g. uniaxial compression) to the initial graphene layer, reducing the volume of the initial graphene layer. The resulting graphene membrane layer can then be affixed to the border or another membrane layer.

Figure 11A:
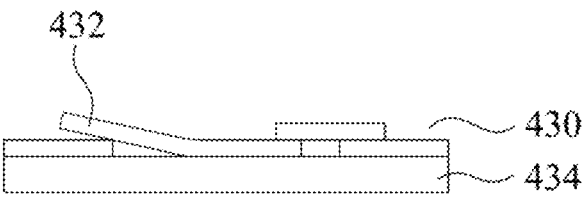
FIGS. 11A-11B are a set of diagrams illustrating the method of FIG. 10, in accordance with some embodiments.
Figure 11B:
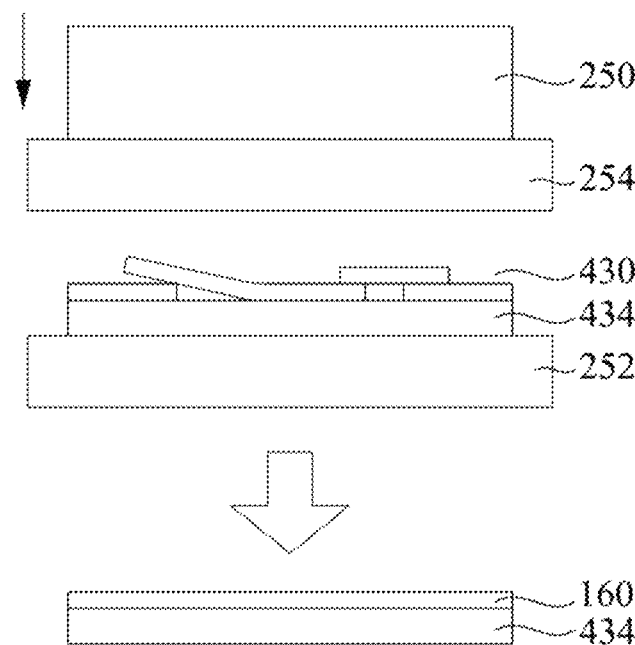
Figure 14:
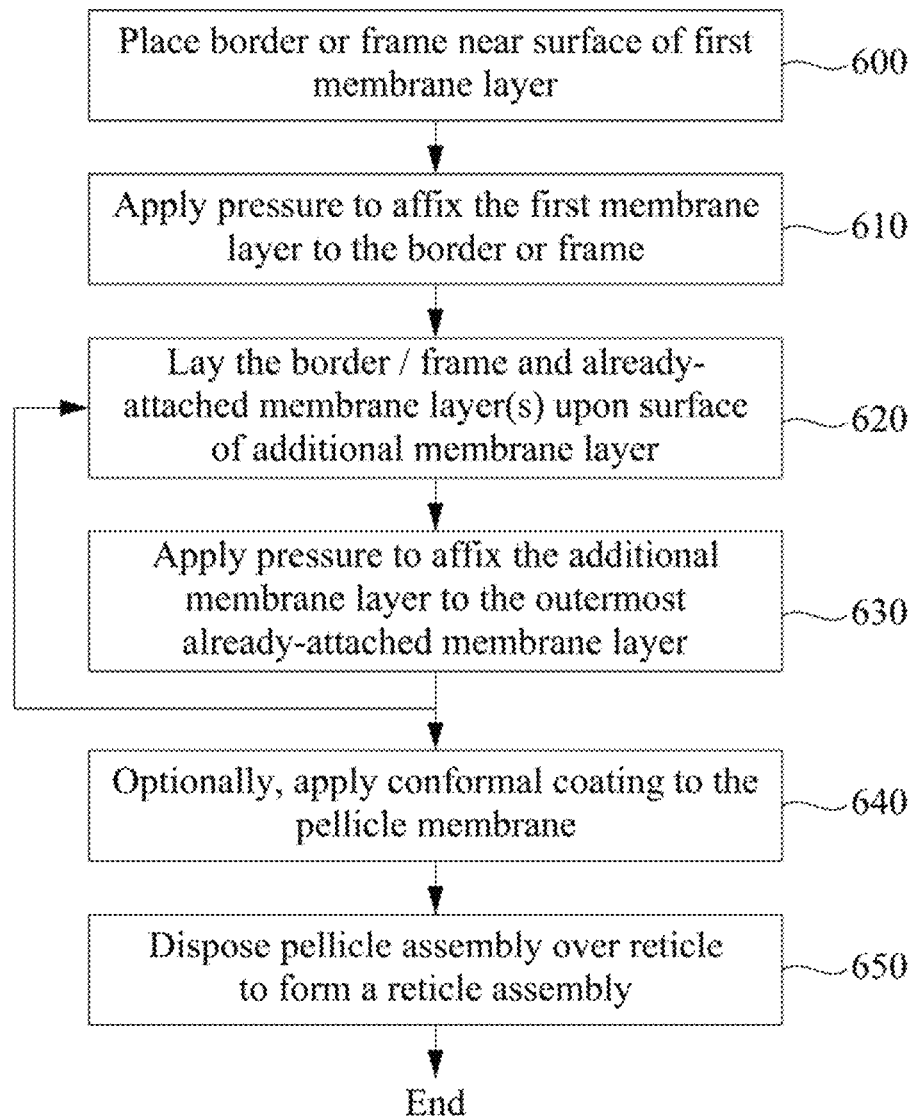
FIG. 14 is a flow chart illustrating a method for preparing a multi-layer structure for a pellicle membrane, in accordance with some embodiments.

FIG. 11A and FIG. 11B are a set of drawings illustrating the method of FIG. 14, in one embodiment. In FIG. 11A, an initial graphene layer 430 is formed by dispersing graphene flakes or sheets 432 on a surface 434. As illustrated in FIG. 11B, the graphene membrane layer 160 is prepared by compressing the initial graphene layer 430 between the bolster plate 252 and the ram 254 of a pressing machine 250.

In some embodiments, each initial nanotube or graphene membrane prior to processing has a thickness of at least 0.7 micron (700 nm), and the processing operates to reduce the thickness to produce an individual nanotube or graphene membrane layer having a thickness of 200 nm or less. In some embodiments, the initial membrane(s) may each have a thickness ranging from about 1 micrometer (μm) to about 10 μm. In some embodiments, the resulting nanotube or graphene membrane layer has a thickness of from about 10 nanometers (nm) to about 100 nm. At higher thicknesses, mechanical properties may change in undesirable ways.

After the membrane layer(s) for the pellicle membrane is/are made, the membrane layer(s) is/are then joined together to form the pellicle membrane. In some embodiments, the final pellicle membrane, which may be made up of one or more membrane layers, should have a thickness of from about 10 nanometers (nm) to about 100 nm, or from about 20 nm to about 70 nm.

Figure 12:
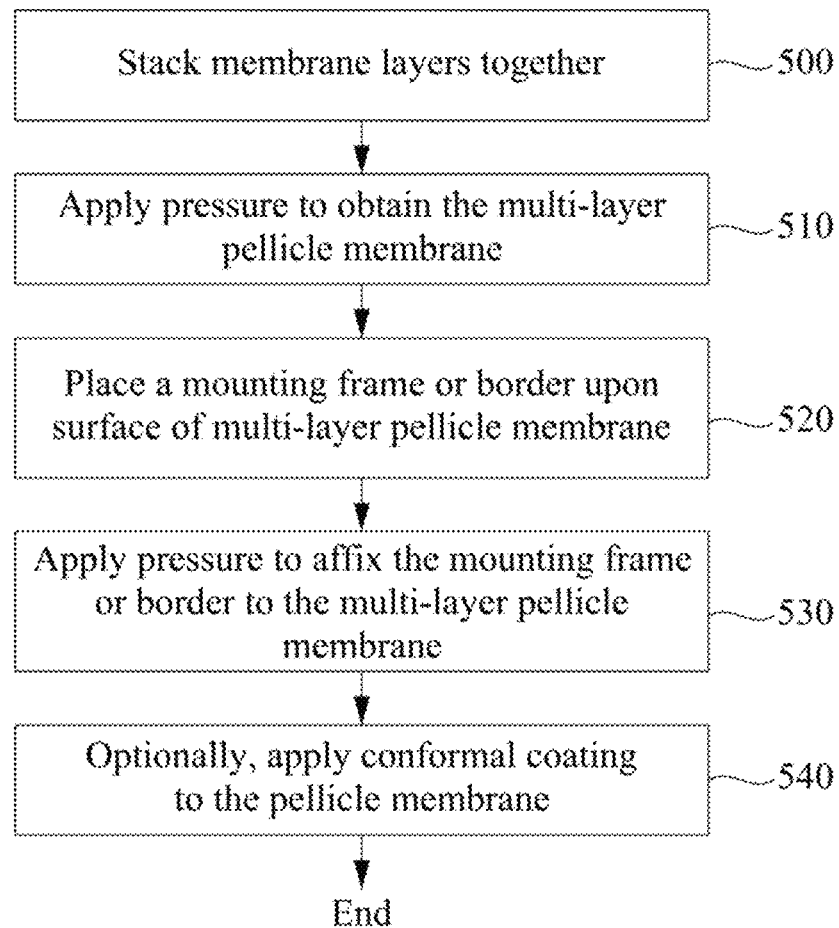
FIG. 12 is a flow chart illustrating another method for preparing a multi-layer structure for a pellicle membrane, in accordance with some embodiments.

FIG. 12 is a flow chart illustrating one embodiment of a method for preparing a multi-layer structure for a pellicle membrane. Very generally, in step 500, the individual layers are stacked upon each other in their desired order. Next, in step 510, pressure is applied to reduce the thickness and join the individual layers together to obtain the multi-layered pellicle membrane. Two or more individual layers can be joined together in this single compression step. Next, in step 520, a mounting frame or border is placed adjacent to a surface of the pellicle membrane. Then, in step 530, pressure is applied to affix the pellicle membrane to the mounting frame or border. In optional step 540, the conformal coating is applied to the pellicle membrane.

Figure 13A:
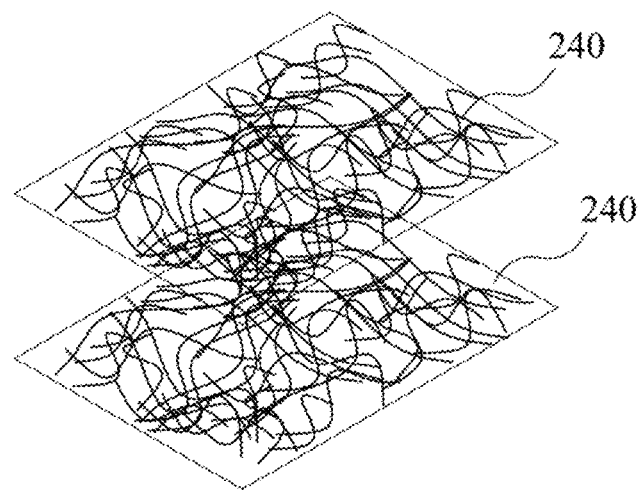
FIGS. 13A-13C are a set of diagrams illustrating the method of FIG. 12, in accordance with some embodiments.
Figure 13B:
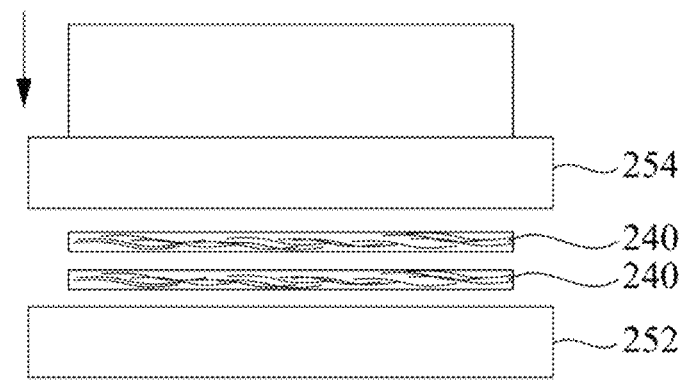
Figure 13C:
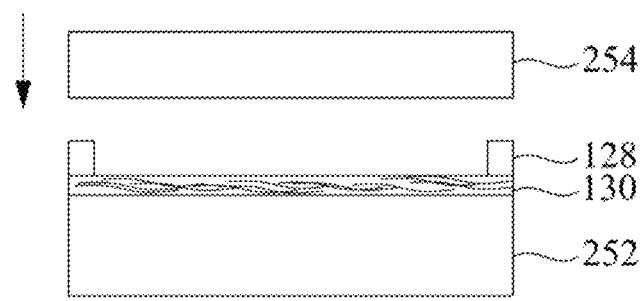

FIGS. 13A-13C are a set of drawings illustrating some steps of the method of FIG. 12, in one embodiment. In FIG. 13A, two initial nanotube membranes 240 formed from nanotube bundles are illustrated. They can be placed at any angle relative to each other, ranging from 0° to 100° and any range in between, although the relative angle is not critical. In FIG. 13B, the two initial nanotube membranes 240 are concurrently compressed between a bolster plate 252 and a ram 254, resulting in the multi-layer pellicle membrane 130. In FIG. 13C, the border 128 is laid upon the pellicle membrane 130, and compressive pressure is applied to join them together. A conformal coating is not applied in this set of drawings.

FIG. 14 is a flow chart illustrating another embodiment of a method for preparing a multi-layer structure for a pellicle membrane. Very generally, in step 600, a border or mounting frame is placed adjacent to a surface of a first membrane layer. Next, in step 610, pressure is applied to affix the first membrane layer to the border/frame. The first membrane layer and the border/frame remain attached via Van der Waals forces. If it is desired to make the pellicle membrane from more than one layer, then in step 620, the border/frame and any already-attached membrane layer(s) are laid upon a surface of the additional membrane layer. The outermost already-attached membrane layer contacts the surface of the additional membrane layer. Next, in step 630, pressure is applied again to affix the additional membrane layer to the already-attached membrane layer(s). Steps 620 and 630 can be repeated with additional membrane layers until the desired multi-layer structure of the pellicle membrane is assembled, and a pellicle assembly is obtained. In optional step 640, the conformal coating is applied to the pellicle membrane. Finally, in step 650, the pellicle assembly is disposed over a mask pattern on a reticle to form a reticle assembly.

Figure 15A:
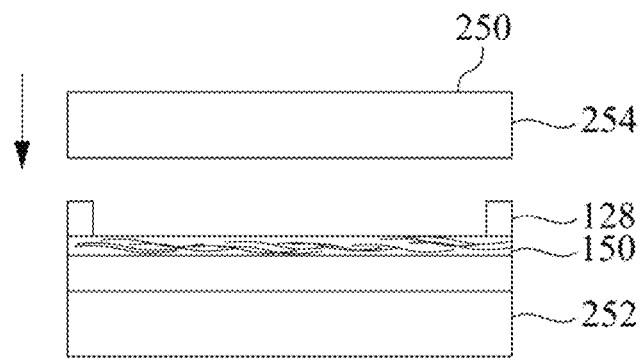
FIGS. 15A-15C are a set of diagrams illustrating the method of FIG. 14, in accordance with some embodiments.
Figure 15B:
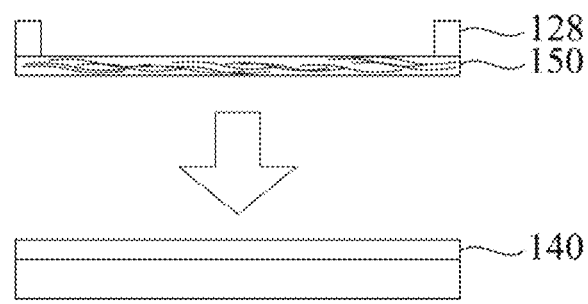
Figure 15C:
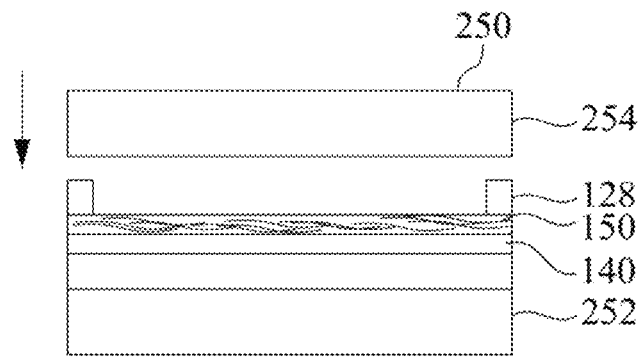

FIGS. 15A-15C are a set of drawings illustrating some steps of the method of FIG. 14, in one embodiment. In FIG. 15A, a thick nanotube bundle layer 150 is affixed to the border 128 through pressure applied by a pressing machine 250 comprising a bolster plate 252 and a ram 254. In FIG. 19B, the border 128 and thick nanotube bundle layer 150 (already attached to the border 128) are then laid upon a thin nanotube bundle layer 140. In FIG. 19C, pressure is again applied through the pressing machine 250 to attach the thin nanotube bundle layer 140 to the thick nanotube bundle layer 150. A multi-layer pellicle membrane can thus be built up successively. It is noted that the thickness of the multi-layer pellicle membrane might vary slightly between the center of the pellicle membrane and the edges of the pellicle membrane where pressure has been used to attach the layers to the border.

If desired, a conformal coating can be applied to the outer surface of the pellicle membrane. The conformal coating can be applied by conventional methods known in the art, such as physical vapor deposition (PVD), chemical vapor deposition (CVD), plasma-enhanced CVD, atomic layer deposition (ALD), plasma-enhanced ALD, e-beam evaporation, electroless deposition, electrodeposition, ion beam deposition (IBD), etc. It is desired that the conformal coating conforms to the exposed surfaces of the pellicle membrane, so that the pores which are present in the pellicle membrane remain present and are not filled by the conformal coating. Such exposed surfaces may be present in any or all of the different layers of a multi-layer pellicle membrane. In addition, the conformal coating will penetrate into the pellicle membrane, rather than being a single discrete layer upon the pellicle membrane.

When applied, the conformal coating is intended to protect the pellicle membrane from damage that can occur due to heat and hydrogen plasma created during EUV exposure. There is a synergistic effect when a conformal coating is applied to thick nanotube bundles with respect to resisting hydrogen damage.

Generally, the material used for the coating should have a low refractive index, i.e. should be as close to 1 as possible when measured at a wavelength of 13.5 nm. The material used for the coating should also have a low extinction coefficient at a wavelength of 13.5 nm. The extinction coefficient measures how easily the material can be penetrated by the wavelength. Desirably, the material used for the conformal coating has a transmittance (T %), when measured at an EUV wavelength of 13.5 nm, of greater than 90%, or of greater than 92%, or of greater than 94%, or of greater than 95%, when measured at a thickness of between 1 nanometer and 10 nanometers. This reduces EUV absorption by the conformal coating (permitting further downstream processing) while protecting the pellicle membrane.

In some embodiments, the conformal coating comprises B, BN, $B_4C$, $B_2O_3$, $B_6Si$; silicon nitrides such as SiN, $Si_3N_4$, or $SiN_2$; SiC, SiZr, $SiC_xN_y$, Nb, NbN, NbSi, NbSiN, $Nb_2O_5$, $NbTi_xN_y$, NbC, $Nb_5Si_3$, $ZrN_x$, $ZrY_xO_y$, ZrF, $ZrF_4$, $ZrSi_2$, YN, $Y_2O_3$, YF, Mo, $MO_2N$, MoSi, $MoSi_2$, MoSiN, $MoC_2$, MoC, $MoS_2$, MoN, Ru, RuNb, RuSiN, $RuO_2$, TiN, $TiC_xN_y$, $HfO_2$, $HfN_x$, $HfF_4$, VN, Rh, Pt, Pd, W, Cr, Ni, Fe, Co, Ag, Au, Zr, Y, or a composite thereof.

In some embodiments, the coating has a thickness of about 0.5 nanometer (nm) to about 10 nm. This thickness should be measured as the thickness of the coating on the individual components of each layer in the pellicle membrane, for example the thickness of the coating on a nanotube bundle. The coating may penetrate deeper into the pellicle membrane than this thickness.

The coating may be in the form of a continuous film, nano-grains, nano-particles, or nano-sheets, or combinations thereof. The coating can be made of multiple layers of the materials listed above, each layer having any of these forms listed above.

FIGS. 16A-16H are cross-sectional views of different illustrative embodiments of nanotube bundles with a coating applied. FIGS. 16I-16L are axial views of some such embodiments.

Figure 16A:
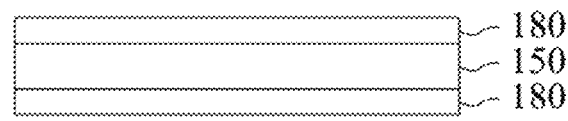
FIGS. 16A-16H are cross-sectional views of different illustrative embodiments of nanotube bundles with a coating applied.

In FIG. 16A, a thick nanotube bundle layer 150 includes a conformal coating 180 which is illustrated here as a continuous film. In some embodiments, the continuous film has a thickness of about 0.5 nm to about 10 nm.

Figure 16B:
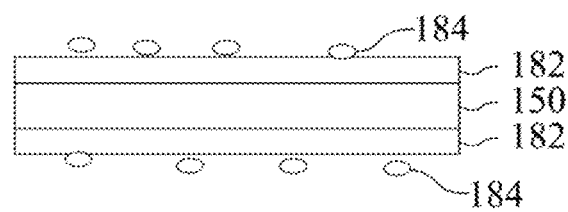

In FIG. 16B, the conformal coating is formed from two different layers. The first coating layer 182 is a continuous film. The second coating layer 184 is illustrated in the form of nano-grains. Nano-grains have a generally ellipsoid shape, whereas nano-particles have a generally spherical shape. In some embodiments, the three axes of a nano-grain may each have a length of from about 0.5 nm to about 10 nm, with the three axes not all having the same length. In some embodiments, the average diameter of a nano-particle may be from about 0.5 nm to about 10 nm.

Figure 16C:
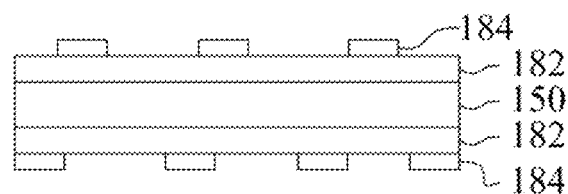

In FIG. 16C, the conformal coating is formed from two different layers. The first coating layer 182 is a continuous film. The second coating layer 184 is illustrated in the form of nano-sheets. Nano-sheets have a thickness and a width, and are not continuous like a film, such that the underlying layer is exposed. In some embodiments, the thickness of the nano-sheet may be from about 0.5 nm to about 10 nm, and the width of the nano-sheet may be from about 1 nm to about 1 micrometer (μm).

Figure 16D:
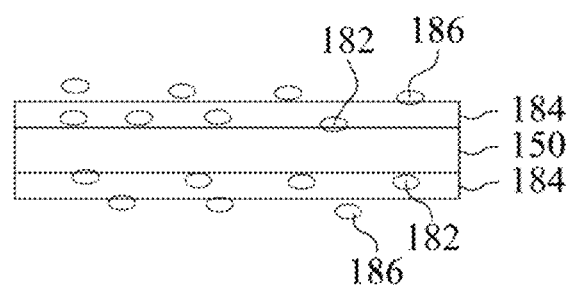

In FIG. 16D, the conformal coating is formed from three different layers. The first coating layer 182 is in the form of nano-grains. A second coating layer 184 is in the form of a continuous film. The third coating layer 186 is illustrated in the form of nano-grains.

Figure 16E:
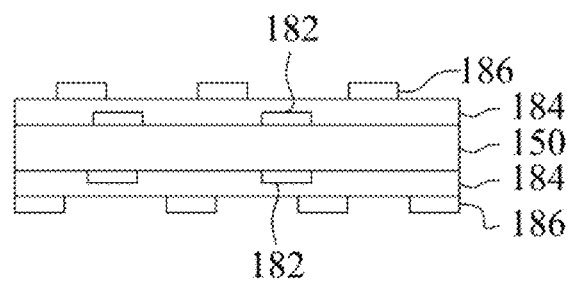

In FIG. 16E, the conformal coating is formed from three different layers. The first coating layer 182 is in the form of nano-sheets. A second coating layer 184 is in the form of a continuous film. The third coating layer 186 is illustrated in the form of nano-sheets.

Figure 16F:
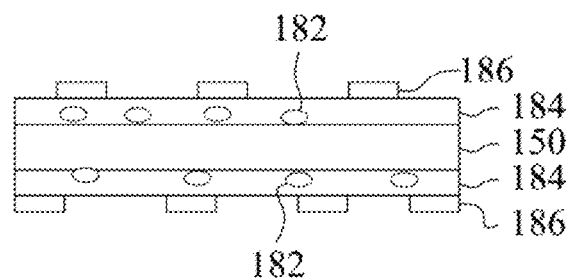

In FIG. 16F, the conformal coating is formed from three different layers. The first coating layer 182 is in the form of nano-grains. A second coating layer 184 is in the form of a continuous film. The third coating layer 186 is illustrated in the form of nano-sheets.

Figure 16G:
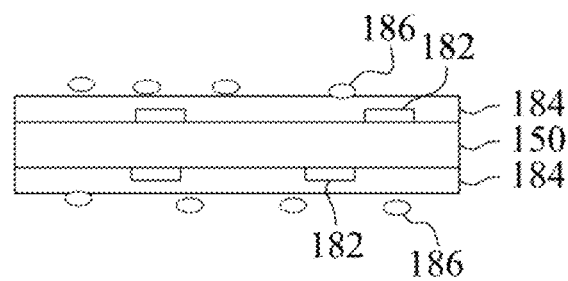

In FIG. 16G, the conformal coating is formed from three different layers. The first coating layer 182 is in the form of nano-sheets. A second coating layer 184 is in the form of a continuous film. The third coating layer 186 is illustrated in the form of nano-grains.

Figure 16H:
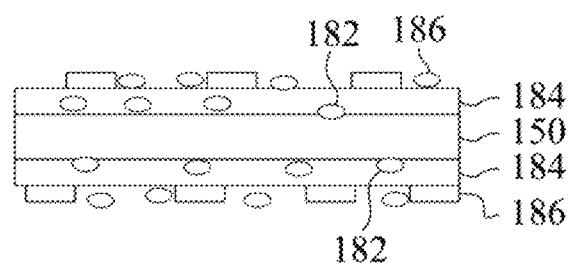

In FIG. 16H, the conformal coating is formed from three different layers. The first coating layer 182 is in the form of nano-sheets. A second coating layer 184 is in the form of a continuous film. The third coating layer 186 is illustrated in the form of nano-grains and nano-sheets. In this embodiment, it is contemplated that the third coating layer could be made from two different materials, one of which is in the form of nano-grains and the other of which is in the form of nano-sheets.

Figure 16I:
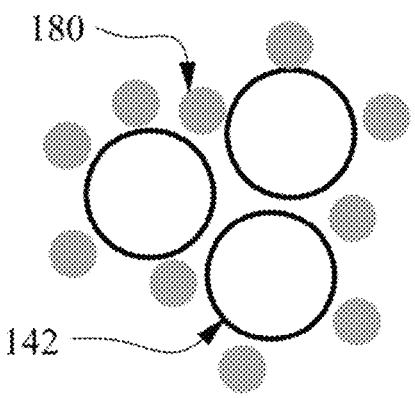
FIGS. 16I-16L are axial views of some such embodiments.
Figure 16J:
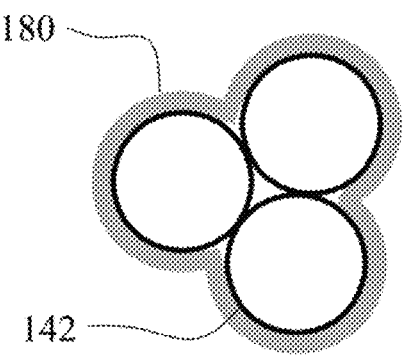

FIG. 16I is an axial view of a thin nanotube bundle 142 having a coating 180 in the form of nano-grains. FIG. 16J is an axial view of a thin nanotube bundle 142 having a coating 180 in the form of a continuous film.

Preferably, the conformal coating is applied in the form of a non-continuous film. This permits EUV light to penetrate through the pellicle membrane.

Figure 16K:
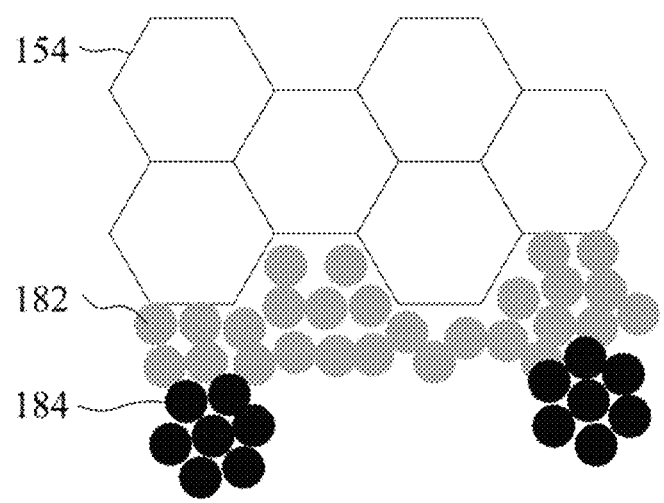

In some particular embodiments, the conformal coating is a two-layer structure like that illustrated in FIG. 16B, having a continuous film and nano-grains. FIG. 16K is a partial axial view of this two-layer structure. Individual nanotubes

154 are illustrated. As illustrated here, the first coating layer 182 can be considered as being made up of several individual molecules which together make up the continuous film. Nano-grains are also illustrated as making up the second coating layer 184.

Figure 16L:
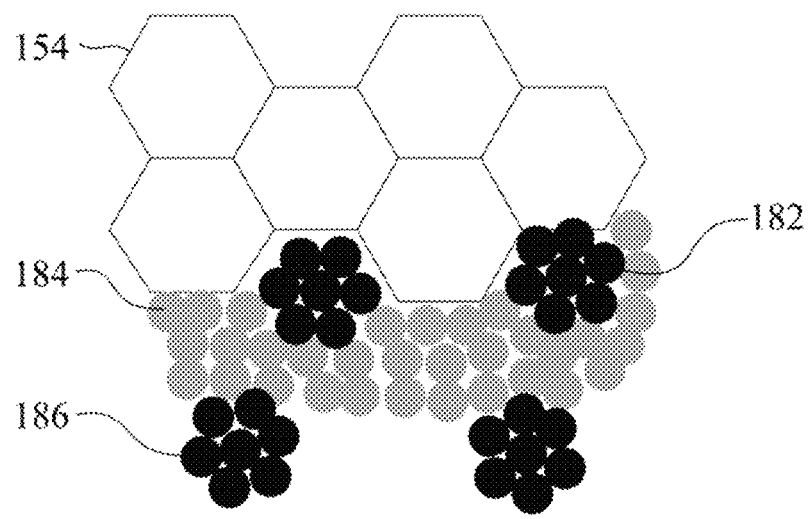

In other embodiments, the conformal coating is a three-layer structure like that illustrated in FIG. 16D. FIG. 16L is a partial axial view of this three-layer structure.

In these two embodiments, the continuous film may be made of a silicon nitride, and the nano-grains may be formed from $RuO_2$. $RuO_2$ aids in resisting hydrogen attack by reducing itself or by causing the formation of $H_2$. The silicon nitride coating slows permeation of hydrogen through the coating and into the nanotube bundles. The inner $RuO_2$ layer of the three-layer structure can serve as a seed layer and also helps to decrease the etching rate of any hydrogen that penetrates to the nanotube bundles.

Generally, the conformal coating is applied to the finished pellicle membrane, rather than to each nanotube bundle layer individually prior to assembly into the pellicle membrane. This also maximizes EUV transmission through the pellicle membrane and to the reticle. The conformal coating may be applied before or after the pellicle membrane is attached to the border or mounting frame.

Figure 17A:
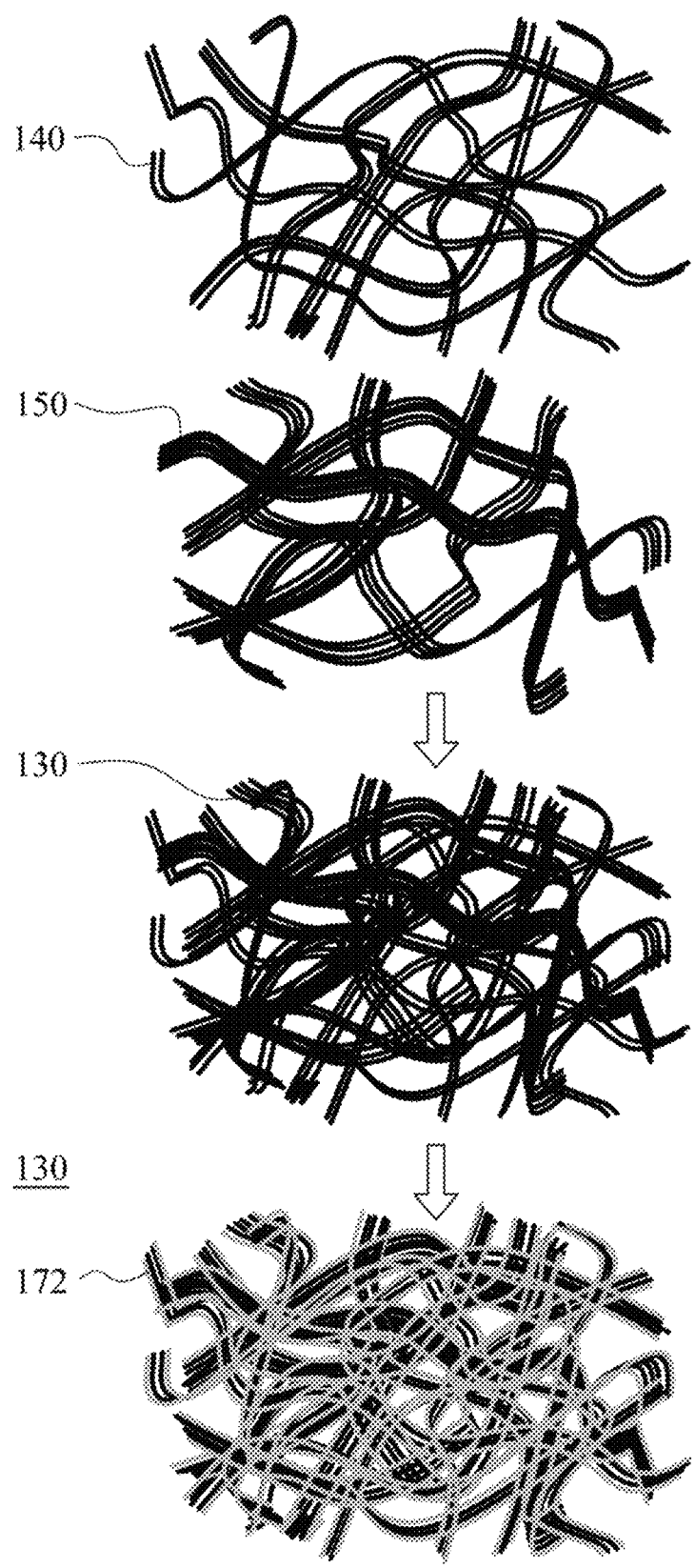
FIG. 17A is a schematic illustration showing a process for coating a pellicle membrane.

FIG. 17A is a schematic illustration showing such a coating process. Starting on the left-hand side, a thick nanotube bundle layer 150 and a thin nanotube bundle layer 140 are illustrated separately. Moving to the right, the two bundle layers are placed upon each other in an overlapping fashion to obtain a pellicle membrane 130. Moving to the right, a coating 172 is then applied to the membrane 130. As illustrated here, the coating is discontinuous, and portions of the nanotubes themselves are visible.

Figure 17B:
FIGS. 17B-17E are a set of diagrams illustrating a method for coating an outer surface of a pellicle membrane, in accordance with some embodiments.
Figure 17C:
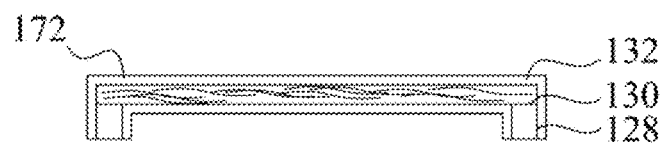
Figure 17D:
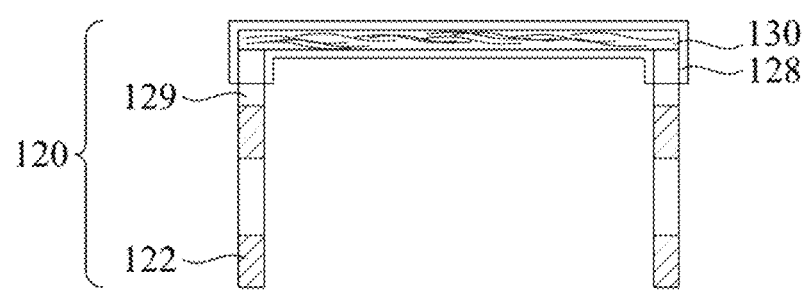
Figure 17E:
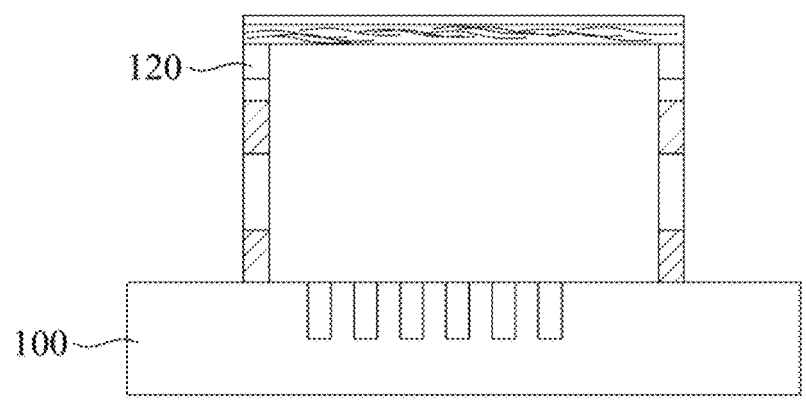

Another application of a conformal coating is illustrated in FIGS. 17B-17E, in one embodiment. FIG. 17B shows the assembly of the border 128 and the pellicle membrane 130, which is comprised of a thick nanotube bundle layer 150 and a thin nanotube bundle layer 140. The border is directly attached to the thick nanotube bundle layer 150. The thin nanotube bundle layer 140 acts as the outer surface 132 of the pellicle membrane 130. As seen in FIG. 17C, the conformal coating 172 is applied to the outer surface 132 of the pellicle membrane 130. It is noted that the coating is illustrated as also being applied to the sides of the pellicle membrane, and the coating can also end up on the border 128 due to the application process. In FIG. 17D, the coated pellicle membrane 130 and border 128 are then attached to a mounting frame 122, for example through adhesive layer 129, to form a pellicle assembly 120. In FIG. 17E, the pellicle assembly 120 is mounted to the reticle 100 (having the desired mask pattern) by securing the frame to the reticle, with the pellicle membrane disposed over the mask pattern, to produce a final reticle assembly, such as that shown in FIG. 1 by way of non-limiting illustrative example.

Referring now to FIGS. 7A-7C and FIG. 17C together, it is noted that one significant distinction between the border 128 and the mounting frame 122 is that the mounting frame 122 includes vent holes 123. These vent holes typically have very small diameters, which can be easily filled or plugged by the coating process illustrated in FIG. 17B. The use of a border 128 is more convenient for applying the conformal coating to the pellicle membrane, while also protecting the vent holes of the mounting frame. If desired, the use of the border can be omitted, with the pellicle membrane being attached directly to a mounting frame of suitable structure. For example, in some embodiments of such mounting frames, vent holes are present at the end of the mounting frame opposite the end to which the pellicle membrane is attached. Referring to FIG. 6A, such a mounting frame could be envisioned as the combination of separate components 122, 129, and 128.

Figure 18:
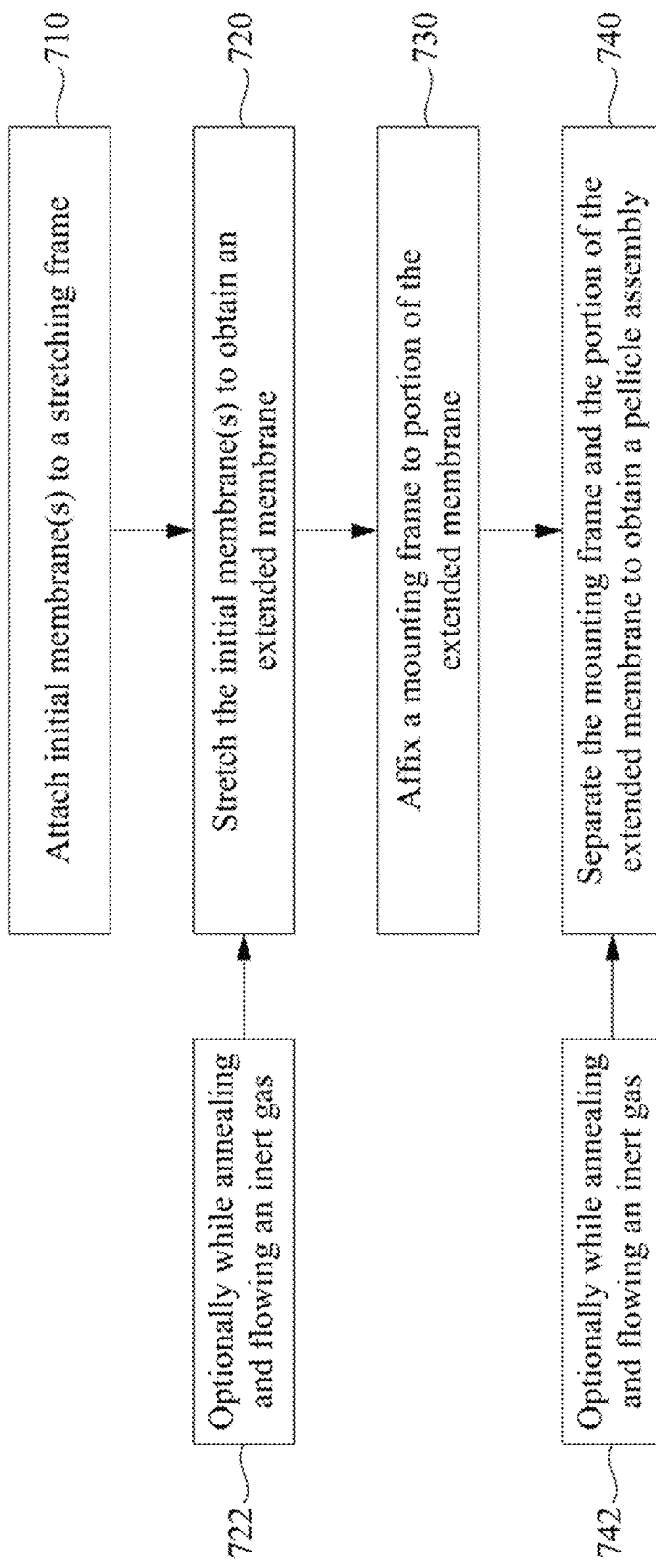
FIG. 18 is a flow chart illustrating another embodiment of a method for preparing a pellicle assembly, in accordance with some embodiments.

FIG. 18 is a flow chart illustrating yet another embodiment of a method for preparing a pellicle assembly. This method is applicable to single-layer or multi-layer membranes formed from nanotube bundles. In step 710, one or more initial membranes is/are attached to a stretching frame. In step 720, the initial membrane(s) is/are stretched to obtain an extended membrane. For example, the initial membrane(s) can be uniaxially stretched or biaxially stretched. In some embodiments, the initial membrane(s) is/are annealed during the stretching. The initial membrane(s) can be annealed at a temperature of about 200° C. to about 800° C. In other embodiments, the initial membrane(s) is/are heated at a temperature of about 200° C. to about 500° C. In some additional embodiments, the stretching is performed while an inert gas is flowed past or through the initial membrane (s). In some embodiments, the inert gas is pure nitrogen gas ($N_2$). These optional steps are indicated in step 722.

In step 730, a mounting frame is affixed to a portion of the extended membrane. The mounting frame has smaller dimensions (in length, or in width, or in both length and width) than the extended membrane, and thus surrounds a portion of the extended membrane. In step 740, the mounting frame and the portion of the extended membrane are then separated from the remainder of the extended membrane to obtain the pellicle assembly. This can be done, for example, by cutting or other similar means. If desired, the annealing and/or inert gas flow can be maintained during these affixing and separating steps (i.e. either one or both of the annealing and inert gas flow), as indicated in step 742. The portion of the extended membrane which is surrounded by the mounting frame can be considered the pellicle membrane. In this method, the initial membrane has a higher density than the final pellicle membrane. The final pellicle membrane is also thinner than the initial membrane(s). The resulting pellicle assembly can again then be attached to a reticle by securing the frame to the mask, with the pellicle membrane disposed over the mask pattern, to produce a final reticle with pellicle assembly, such as that shown in FIG. 1.

FIGS. 19A-19D illustrate one embodiment of the method of FIG. 18. FIG. 19A shows a plan view, a length-side view, and a width-side view of the stretching frame without any membranes thereon. As illustrated here, the stretching frame 810 includes at least four side walls. Two adjacent side walls 820, 830 are fixed in place and can be made as one piece if desired. The other two side walls 840, 850 are mobile. As illustrated here, each mobile side wall is threaded upon two rods and fixed in place relative to each rod using nuts. For example, mobile side wall 840 is attached to rods 842 using nuts 844, and one end of each rod 842 is attached to opposite side wall 820. Similarly, mobile side wall 850 is attached to rods 852 using nuts 854, and one end of each rod 852 is attached to opposite side wall 830. As seen in the side views, rods 842 and rods 852 are on different planes along the height of the side walls.

In FIG. 19B, one or more initial membranes 860 is/are attached to each side wall of the stretching frame 810. This can be accomplished, for example, using a suitable adhesive.

In FIG. 19C, the mobile side walls 840, 850 are extended along the X-axis and the Y-axis. As illustrated here, the mobile side walls 840, 850 are slid along the rods to a desired location, and the nuts are then tightened to hold them in place. This extension stretches the initial membrane(s) along two different axes, forming an extended membrane 870. The extended membrane 870 also has a lower density than the initial membrane 860, and the extended membrane 870 is thinner than the initial membrane 860.

In FIG. 19D, a mounting frame 122 is affixed to a portion 872 of the extended membrane 870. The mounting frame 122 has fixed dimensions and is attached to one side of the extended membrane 870. The mounting frame 122 and the portion 872 of the extended membrane are then cut out of the extended membrane, or separated from the remainder of the extended membrane, to obtain the pellicle assembly 120.

Figure 20A:
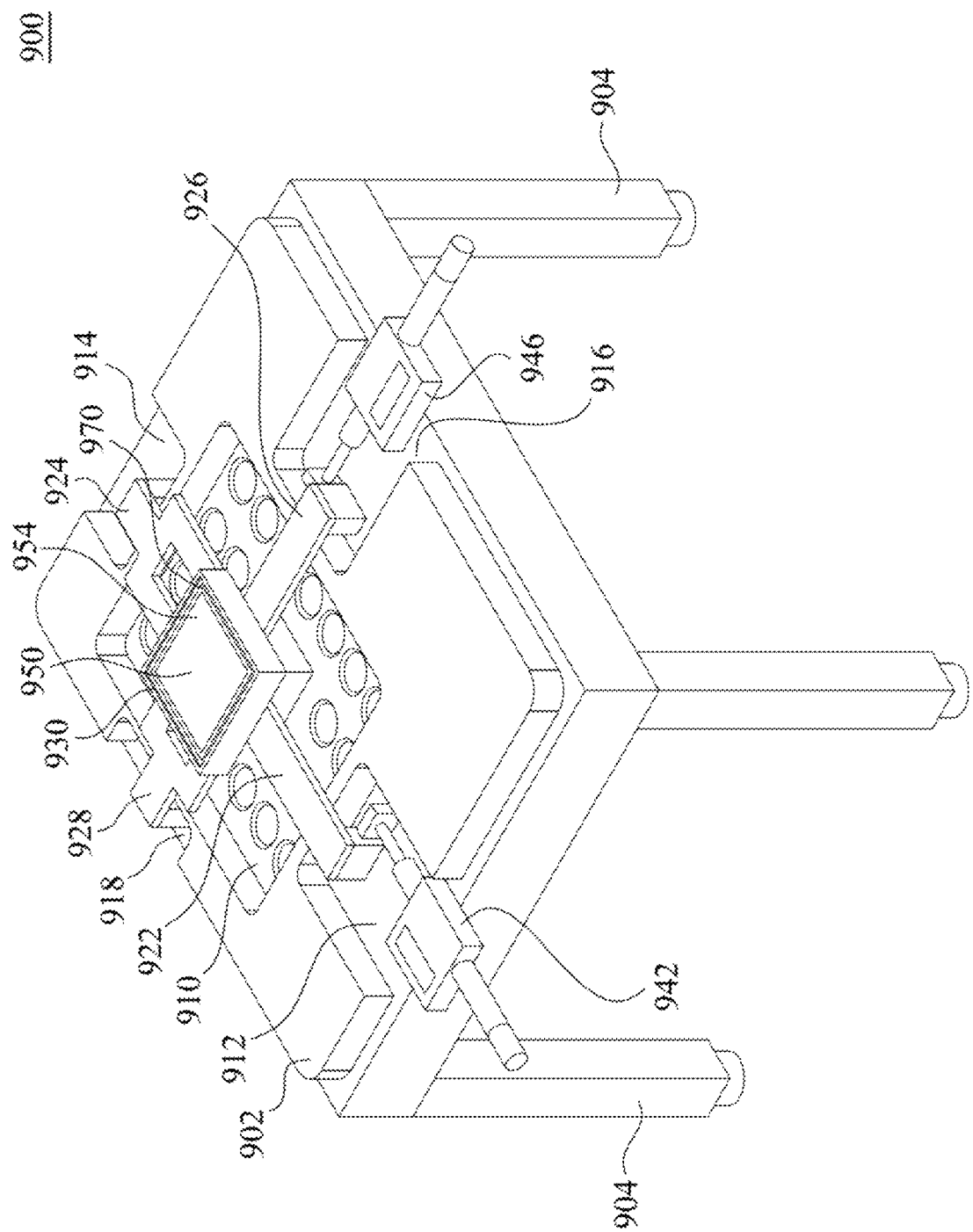
FIGS. 20A-20B are a set of diagrams illustrating an exemplary membrane stretching device, in accordance with some embodiments.
Figure 20B:
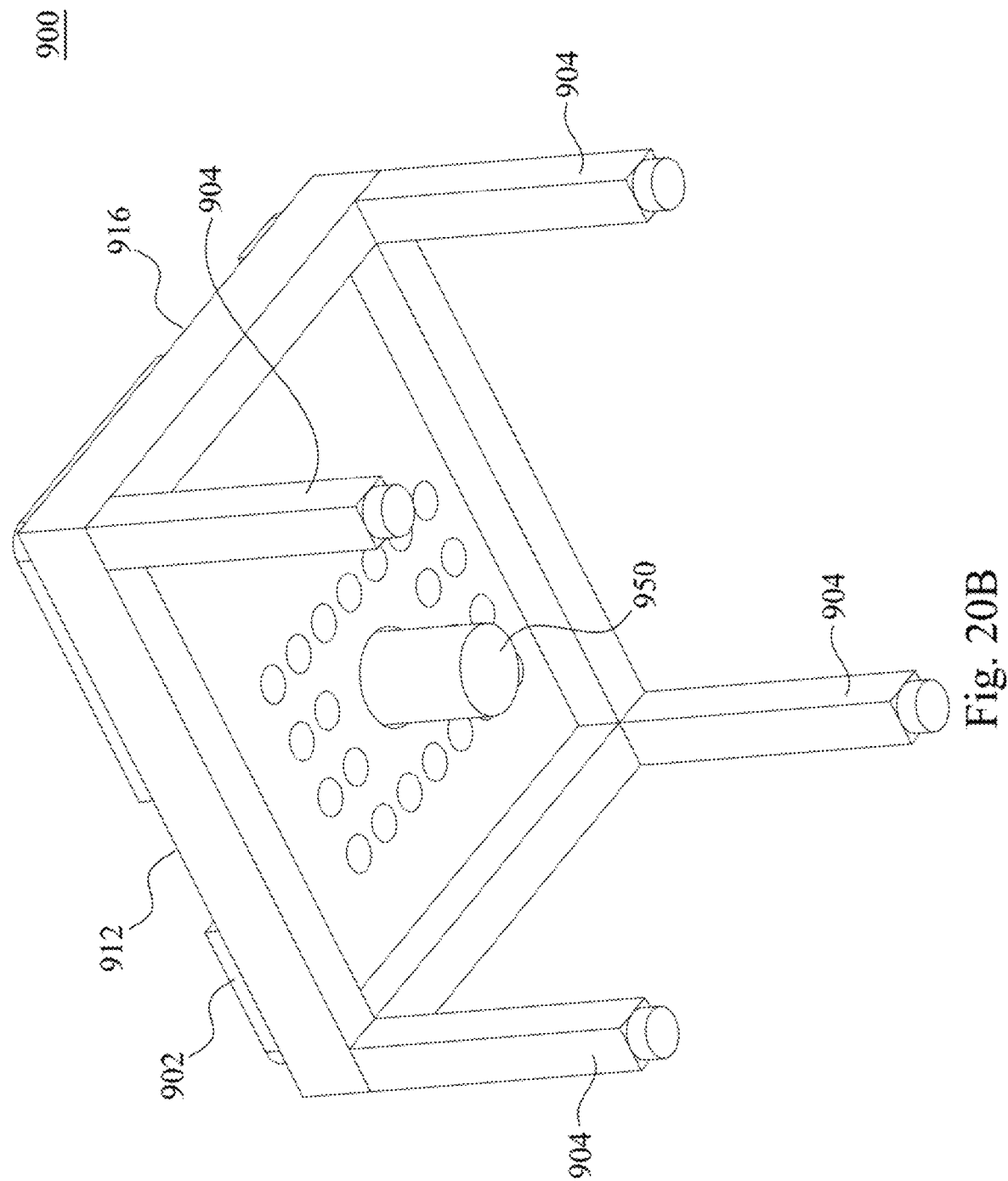

FIG. 20A and FIG. 20B are two views depicting an exemplary embodiment of a membrane stretching table 900 which can also be used to stretch an initial nanotube membrane to obtain an extended membrane. Referring first to FIG. 20A, the table 900 includes a top 902 and four legs 904, one in each corner of the top. If desired, the table can be made to be a self-leveling table using methods known in the art.

A large central recess 910 is present in the table top, away from the perimeter of the table top. Four smaller side recesses (relative in size to the central recess) 912, 914, 916, 918 are also present in the table top, one on each side of the table. A first x-axis side recess 912 is larger (in area) than a second x-axis side recess 914 on an opposite side of the table. A first y-axis side recess 916 is larger than a second y-axis side recess 918 on an opposite side of the table.

A first x-axis arm 922 extends from the first x-axis recess 912 towards and over the central recess 910. A second x-axis arm 924 extends from the second x-axis recess 914 towards and over the central recess 910. A first y-axis arm 926 extends from the first y-axis recess 916 towards and over the central recess 910. A second y-axis arm 928 extends from the second y-axis recess 918 towards and over the central recess 910.

The four arms 922, 924, 926, 928 are each joined to membrane stretching frame 930. The membrane stretching frame is separable from the four arms, and has four sides. The four arms are each joined to a different side of the membrane holding frame. It is noted that as illustrated here, the central recess 910 is much larger than the membrane stretching frame 930. It is contemplated that the table can be used to stretch membranes of varying starting sizes.

As illustrated here, second x-axis arm 924 and second y-axis arm 928 are stationary, while first x-axis arm 922 and first y-axis arm 926 are able to move along the x-axis and the y-axis, respectively. An x-axis caliper 942 is attached to the first x-axis arm 922 and a y-axis caliper 946 is attached to the first y-axis arm 926, for measuring the amount of movement. It is also contemplated that in some embodiments, all of the arms 922, 924, 926, 928 could be mobile. Additional calipers may be used for measuring the degree of movement.

A vertical piston 950 is located within the central recess 910, within the area bounded by the membrane stretching frame. As illustrated here, the head of the piston has a rectangular cross-section. In addition, as illustrated here, the piston is a concentric piston, with an annular outer head 952 and an inner head 954 which can be separately raised and lowered. It is also contemplated that the piston may have a single head, rather than an outer head and an inner head. A caliper (not shown) may also be present for measuring movement by the piston in the z-axis. Referring to FIG. 20B, the bottom of the piston 950 is visible.

It has been found that a nanotube membrane can be stretched up to 10 μm per 1 cm of unstretched length of the initial membrane along the x-, y-, or z-axis. If the membrane is stretched too much, its structure can be destroyed. Thus, the calipers 942, 946 are used to measure the degree of stretching.

FIGS. 21A-21D are a set of side cross-sectional views that depict a first exemplary process of stretching a membrane which can be performed using stretching table 900 to obtain a pellicle membrane. In this exemplary process, the initial membrane is stretched by movement in three directions to reduce its thickness and obtain the nanotube membrane. In addition, in this process, the nanotube membrane can be attached to a mounting frame or a border.

Figure 21B:
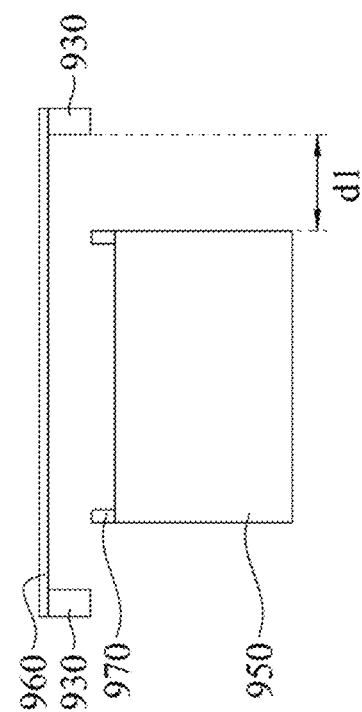
FIGS. 21A-21D are a set of side cross-sectional diagrams illustrating a first exemplary process of stretching a membrane with a membrane stretching device, in accordance with some embodiments.
Figure 21A:
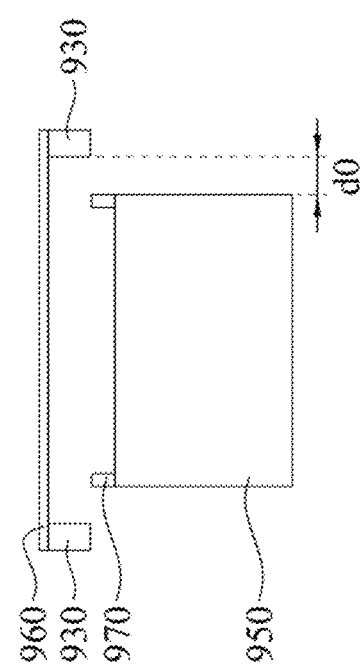

Starting with FIG. 21A, the initial membrane 960 is attached to stretching frame 930. The piston 950 is illustrated here for reference. The distance d0 represents the starting position of the stretching frame and the membrane before stretching, relative to the piston. Also mounted to the head of the piston is a mounting frame 970. At this point, the mounting frame 970 does not contact the initial membrane 960.

Next, in FIG. 21B, the initial membrane 960 is stretched by the stretching frame 930 along the x-axis and/or y-axis. This is indicated by distance d1, which is greater than distance d0. This stretching will also reduce the thickness of the initial membrane. The mounting frame 970 still does not contact the membrane 960.

Figure 21D:
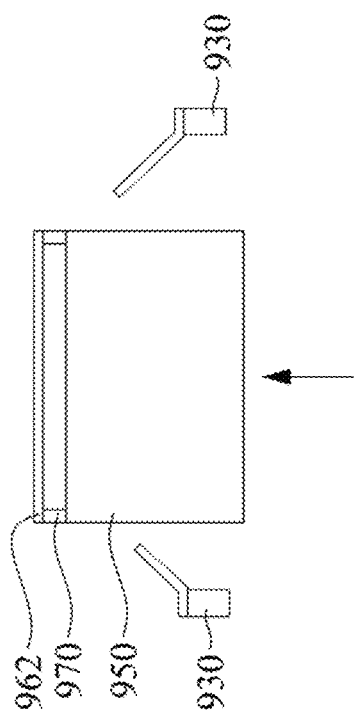
Figure 21C:
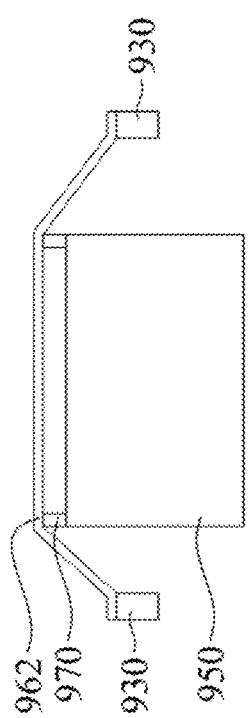

Moving to FIG. 21C, the piston 950 now moves upwards in the z-axis, so that the mounting frame 970 is affixed to the initial membrane, for example via van der Waals forces, to obtain the nanotube membrane 962. The movement in the z-axis will impart shear forces to the nanotube membrane, which will cause some additional stretching of the nanotube membrane, although the majority of the stretching occurs in the x-axis and/or y-axis.

Lastly, as depicted in FIG. 21D, the mounting frame 970 and a portion of the nanotube membrane 962 is cut out and separated from the stretching frame 930 and the remainder of the nanotube membrane 962. A pellicle assembly (still mounted to the piston) is the result.

Figure 22A:
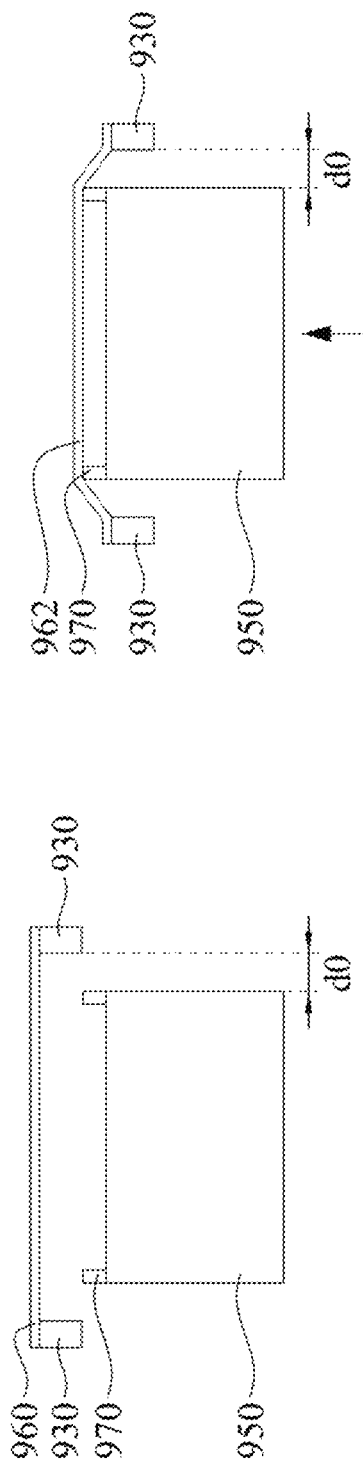
FIGS. 22A-22C are a set of side cross-sectional diagrams illustrating a second exemplary process of stretching a membrane with a membrane stretching device, in accordance with some further embodiments.
Figure 22B:
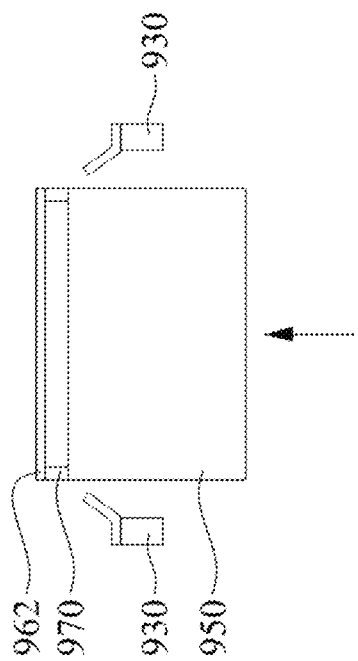
Figure 22C:
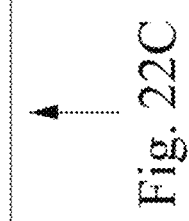

FIGS. 22A-22C are a set of side cross-sectional views that depict a second exemplary process of stretching a pellicle membrane which can be performed using stretching table 900. In this embodiment, the initial membrane is stretched by movement in only one direction.

Starting with FIG. 22A, again the initial membrane 960 is attached to stretching frame 930. Distance d0 represents the starting position of the stretching frame and the membrane before stretching, relative to the piston 950. Also mounted to the head of the piston is a mounting frame 970.

Next, in FIG. 22B, the piston 950 pushes upwards in the z-axis, with the mounting frame 970 being affixed to the initial membrane, for example via van der Waals forces, to obtain the nanotube membrane 962. The initial membrane is not stretched by movement along the x-axis or the y-axis in this second exemplary process.

Finally, as depicted in FIG. 22C, the mounting frame 970 and a portion of the nanotube membrane 962 is separated from the stretching frame 930 and the remainder of the nanotube membrane 962. A pellicle assembly (still mounted to the piston) is the result. Again, the degree of stretching of the membrane is greater in the first exemplary method of FIGS. 21A-21D compared to the second exemplary method of FIGS. 22A-22C.

In one experiment using the table of FIG. 20A, an initial membrane of size 7 cm×7 cm prior to stretching had a deflection of 1325 μm. The initial membrane was then stretched an additional 26 μm in both the x-axis and the y-axis. Afterwards, the stretched membrane had a deflection of only 727 µm, which is an improvement of over 40%.

Figure 23:
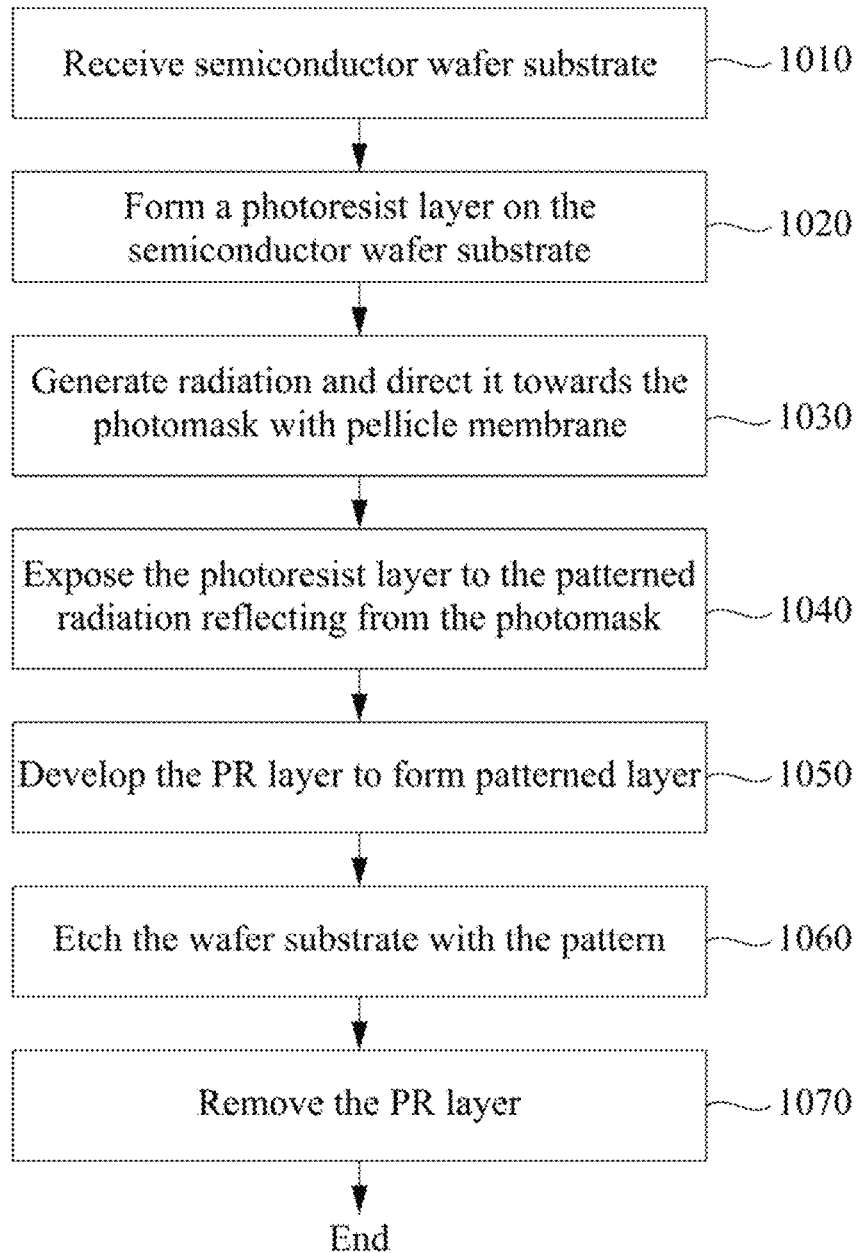
FIG. 23 is a flow chart illustrating a method for processing a semiconductor wafer substrate, in accordance with some embodiments.

FIG. 23 is a flowchart illustrating a method for processing a semiconductor wafer substrate, in accordance with some embodiments. FIGS. 24A-24C and FIG. 25 illustrate some of the steps in this method.

In step 1010 of FIG. 23, a semiconductor wafer substrate is received. The substrate is placed in a fixed location within a photolithographic device.

In step 1020 of FIG. 23, a photoresist (PR) layer is formed on the semiconductor wafer substrate. The PR layer is typically deposited using spin-coating, though other methods known in the art can also be used.

Figure 24A:
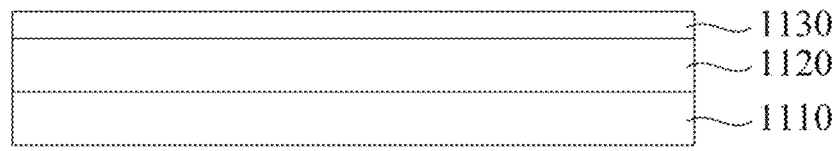
FIGS. 24A-24C are diagrams illustrating some steps of the method for processing a semiconductor wafer substrate, in accordance with some embodiments.

FIG. 24A is a side cross-sectional view of the wafer substrate after step 1020. Here, a metal layer 1120 is present on the semiconductor wafer substrate 1110, and the photoresist layer 1130 is present upon the metal layer.

Figure 25:
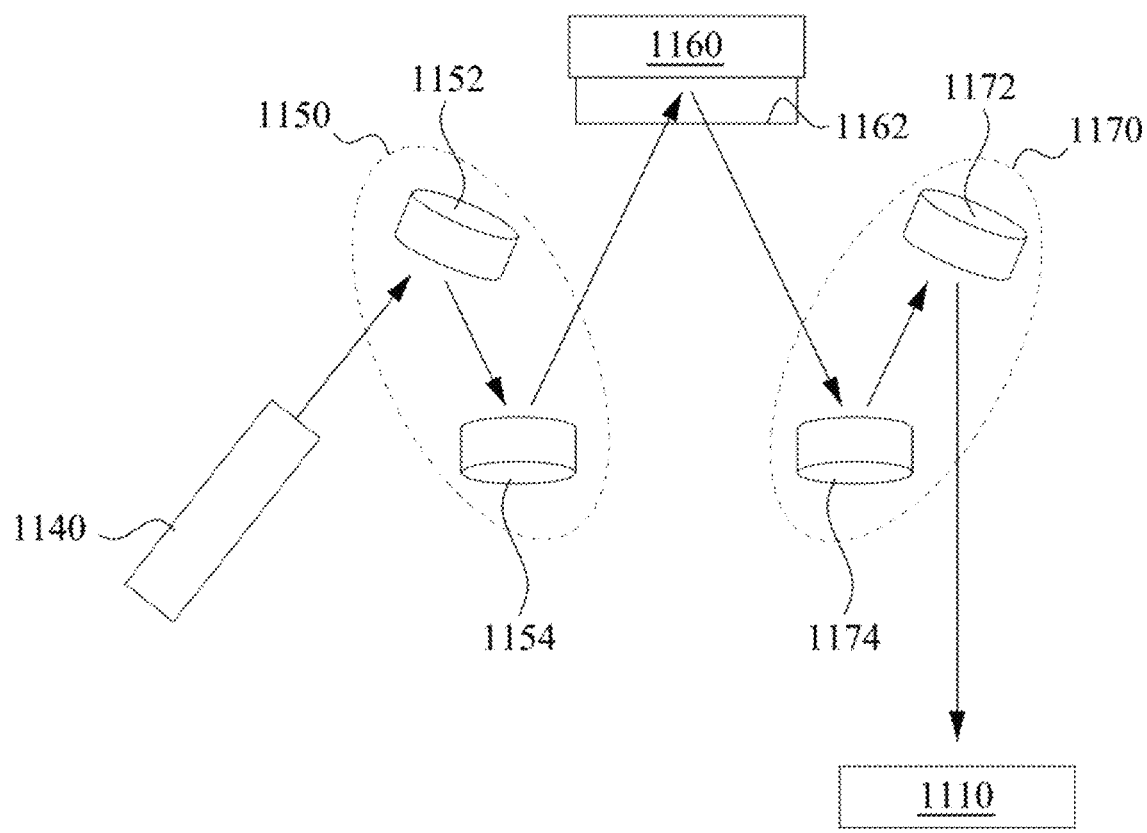
FIG. 25 is an illustration of radiation traveling to the photomask, being reflected, and exposing a photoresist layer on a semiconductor wafer substrate, in accordance with some embodiments.

In step 1030 of FIG. 23, radiation is generated and directed at the photomask or reticle using an exposure tool. FIG. 25 is an illustrative schematic diagram, not drawn to scale, illustrating the various components of an extreme ultraviolet (EUV) lithography system which can be used as an exposure tool. Generally, the EUV lithography system begins with an EUV light source 1140 that generates EUV light or radiation. Downstream of the EUV light source is an illumination stage 1150 in which the EUV light may be collected and focused as a beam, for example using field facet mirror 1152 that splits the beam into a plurality of light channels. These light channels can then directed using one or more relay mirrors 1154 onto the plane of the photomask. The photomask 1160 includes a pellicle membrane 1162, through which the radiation passes before and/or after contacting the photomask. Downstream of the photomask 1160 is the projection optics module 1170, which is configured for imaging the pattern of the photomask onto the semiconductor wafer substrate 1110, such as a silicon wafer. The projection optics module 1170 may include refractive optics or reflective optics for carrying the image of the pattern defined by the photomask. Illustrative mirrors 1172, 1174 are shown. The lithography system can include other modules or be integrated with or coupled to other modules. In more specific embodiments, the EUV lithography system has a numerical aperture (NA) of greater than 0.5.

The photomask/reticle is patterned. In particular embodiments, the photomask is a reflective photomask. The photomask/reticle includes a pellicle membrane as described herein. The pellicle membrane comprises at least one nanotube membrane layer that contains nanotubes with a minimum length of 1,000 micrometers (µm). The radiation contacts the photomask/reticle, and is used to transfer the pattern thereon.

In step 1040 of FIG. 23, the PR layer is exposed to the patterned radiation reflected from the photomask. The exposed portion of the photoresist is photochemically modified.

Figure 24B:
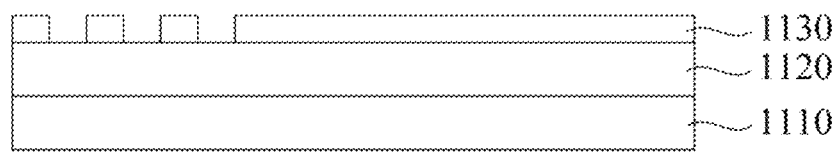

In step 1050 of FIG. 23, the PR layer is developed, such that the pattern from the photomask is now made in the PR layer. This is illustrated in FIG. 24B.

Figure 24C:
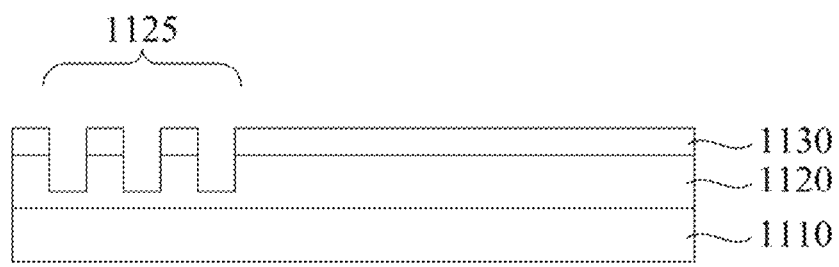

In step 1060 of FIG. 23, the wafer substrate is etched to transfer the pattern to the substrate. This can be done, for example, using dry etching or wet etching. Referring now to FIG. 24C, trenches 1125 are now present in the metal layer 1120.

In step 1070 of FIG. 23, the PR layer is removed. Further processing steps can then be performed. The method then ends.

Because the pellicle membrane is in the optical path between the reticle and the wafer upon which the transferred pattern is to be imaged, certain optical properties are desired for the pellicle membrane. For example, the pellicle membrane should have high transmittance (i.e. optically transparent) for EUV wavelengths, low reflectivity for EUV wavelengths, low non-uniformity, and low scattering. During exposure and regular operations, the pellicle membrane will be exposed to high temperatures, and so certain thermal properties are also desirable. For example, the pellicle membrane should have low thermal expansion, high thermal conductivity, and high thermal emissivity. The pellicle membrane should also have good mechanical properties, such as high stiffness (i.e. low sagging or deflection) and stability. The pellicle membranes of the present disclosure have combinations of these desired properties.

The methods described herein provide a pellicle membrane with an improved combination of EUV transmittance, pore size, stiffness, and service lifetime. The use of thick nanotube bundles to form the nanotube membrane layer in the pellicle membrane increases the service lifetime and resists hydrogen damage. The pellicle membranes of the present disclosure maintain high transmittance in the EUV wavelength range. This permits more light to reach the photomask for a given exposure energy and also reduces heat buildup in the pellicle membrane. In some embodiments, the pellicle membranes have a transmittance (T %), when measured at an EUV wavelength of 13.5 nm, of greater than 90%, or of greater than 95%, or of greater than 96%, or of greater than 97%.

One means by which the high transmittance is obtained is through the presence of pores in the pellicle membrane, since the pores do not reflect or absorb EUV wavelengths. The pellicle membranes of the present disclosure have an average pore size that is small enough to prevent particles from passing through the pellicle membrane and landing on the reticle/photomask. In some embodiments, the maximum pore size of the pores in the pellicle membranes is less than 100 nm in diameter (after the conformal coating has been applied). In this regard, a pore is considered to be any straight path that passes entirely through the pellicle membrane. Pores may be present due to spaces between nanotube bundles, or between the flakes/sheets of graphene or graphite. The pore size is the smallest diameter of this straight path (because a particle only has to be trapped before passing through the pellicle membrane, it does not have to be stopped at the outer surface of the pellicle membrane). In a multi-layer pellicle membrane, the pore size of the pellicle membrane is usually much smaller, because the pores of a given membrane layer do not align with the pores of another membrane layer. The pore size can be measured using conventional methods, for example by imaging the membrane and measuring the size of each pore.

The increased stiffness of the pellicle membrane minimizes any potential sagging or deflection that may occur over time. For example, the dimensions of the pellicle membrane (length and width) are on the order of about 100 millimeters. The pellicle membranes of the present disclosure may sag or deflect in the range of about 100 µm to about 300 µm under an applied pressure differential of two pascals (Pa). In embodiments, the pellicle membrane may have a thickness ranging from about 10 nanometers (nm) to about 100 nm, or from about 20 nm to about 70 nm.

The pellicle membranes of the present disclosure also have low reflectivity for EUV wavelengths. Again, this permits more light to reach the photomask for a given exposure energy and also reduces critical dimension (CD)

error. In some embodiments, the pellicle membranes have a reflectivity (R %), when measured at an EUV wavelength of 13.5 nm, of 5% or less, or of 3% or less, or of 2% or less, or of 1% or less, or of 0.5% or less.

The pellicle membranes of the present disclosure also have low non-uniformity at EUV wavelengths, or in other words have high uniformity. This reduces local CD error that can otherwise occur. In some embodiments, the pellicle membranes have a non-uniformity (U %), when measured at an EUV wavelength of 13.5 nm, of 1% or less, or of 0.5% or less, or of 0.3% or less, or of 0.1% or less.

Some embodiments of the present disclosure thus relate to methods of forming a pellicle assembly. An initial membrane is provided, which is formed from thick nanotube bundles formed from more than 20 nanotubes. Sometimes, 25 or more nanotubes (i.e. at least 25 nanotubes) are used. The thickness of the initial membrane is reduced to obtain a first nanotube layer for a pellicle membrane, using methods described herein. The pellicle membrane may be a single-layer structure or a multi-layer structure. The pellicle membrane is then affixed to a mounting frame to obtain the pellicle assembly.

Other embodiments of the present disclosure also relate to methods of forming a pellicle assembly. An initial membrane is provided, which is formed from nanotube bundles having an average diameter of 25 nanometers or greater. The nanotube bundles are formed from multi-wall nanotubes. The thickness of the initial membrane is reduced to obtain a first nanotube layer for a pellicle membrane, using methods described herein. The first nanotube layer is combined with a second nanotube layer formed from thin nanotube bundles to form the pellicle membrane.

Other embodiments of the present disclosure relate to methods for forming a reticle assembly. A pellicle membrane is affixed to a mounting frame to obtain a pellicle assembly. The pellicle membrane comprises at least one nanotube membrane layer formed from thick nanotube bundles, either in terms of the number of nanotubes in a bundle or in the large diameter of the bundle. The pellicle assembly is then disposed over a mask pattern on a reticle to form the reticle assembly.

Some other embodiments of the present disclosure relate to methods for producing a reticle assembly. A pellicle assembly is mounted over a mask pattern on a reticle. The pellicle assembly comprises a multi-layer pellicle membrane having a conformal coating on an outer surface thereof. At least one layer of the multi-layer pellicle membrane is a nanotube membrane layer formed from thick nanotube bundles, either in terms of the number of nanotubes in a bundle or in the large diameter of the bundle.

Finally, other embodiments of the present disclosure relate to pellicle membranes and pellicle assemblies. The pellicle membrane is a single-layer structure or a multi-layer structure, and comprises thick nanotube bundles, either in terms of the number of nanotubes in a bundle or in the large diameter of the bundle. The pellicle membrane is affixed or attached to a mounting frame or border to form a pellicle assembly. In some embodiments, a conformal coating is present upon at least an outer surface of the pellicle membrane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pellicle assembly, comprising:
reducing a thickness of an initial membrane to obtain a first nanotube layer for a pellicle membrane, wherein the initial membrane is formed from thick nanotube bundles which have an average diameter of 25 nanometers or greater and which are formed from 25 or more nanotubes;
reducing a thickness of at least one second membrane to obtain at least one second nanotube layer for the pellicle membrane, wherein the at least one second membrane is formed from thin nanotube bundles which have an average diameter of about 4 nanometers to about 20 nanometers, and which include from one to 20 nanotubes;
joining the first nanotube layer and the at least one second nanotube layer together to form the pellicle membrane; and
affixing the pellicle membrane to a mounting frame to obtain the pellicle assembly.

2. The method of claim 1, wherein the first nanotube layer has pores with an average diameter of about 1 nanometer to about 100 nanometers.

3. The method of claim 1, wherein each thick nanotube bundle is formed from multi-wall nanotubes.

4. The method of claim 1, wherein the pellicle membrane further comprises a graphene membrane layer.

5. The method of claim 1, wherein the first nanotube layer is placed between two second nanotube layers that are formed from thin nanotube bundles.

6. The method of claim 1, wherein the thick nanotube bundles comprise carbon nanotubes, boron nitride nanotubes, silicon carbide nanotubes, molybdenum disulfide nanotubes, molybdenum diselenide nanotubes, tungsten disulfide nanotubes, or tungsten diselenide nanotubes.

7. The method of claim 1, wherein a conformal coating is applied to at least an outer surface of the pellicle membrane.

8. The method of claim 7, wherein the conformal coating comprises B, BN, $B_4C$, $B_2O_3$, $B_6Si$, SiN, $Si_3N_4$, $SiN_2$, SiC, SiZr, $SiC_xN_y$, Nb, NbN, NbSi, NbSiN, $Nb_2O_5$, $NbTi_xN_y$, NbC, $Nb_5Si_3$, $ZrN_x$, $ZrY_xO_y$, ZrF, $ZrF_4$, $ZrSi_2$, YN, $Y_2O_3$, YF, Mo, $Mo_2N$, MoSi, $MoSi_2$, MoSiN, $MOC_2$, MOC, $MoS_2$, MON, Ru, RuNb, RuSiN, $RuO_2$, TIN, $TiC_xN_y$, $HfO_2$, $HfN_x$, $HfF_4$, VN, Rh, Pt, Pd, W, Cr, Ni, Fe, Co, Ag, Au, Zr, Y, or a composite thereof.

9. The method of claim 7, wherein the coating is in the form of a continuous film, nano-grains, nano-particles, or nano-sheets.

10. The method of claim 1, wherein the thickness of the initial membrane is reduced by applying pressure.

11. The method of claim 1, wherein the thickness of the initial membrane is reduced by:
stretching the initial membrane using a stretching frame to obtain an extended membrane;
affixing a mounting frame to a portion of the extended membrane; and
separating the mounting frame and the portion of the extended membrane from the remainder of the extended membrane, to obtain the pellicle assembly.

12. The method of claim 11, wherein the initial membrane is stretched biaxially.

13. The method of claim 1, further comprising annealing the initial membrane while stretching the initial membrane.

14. The method of claim 13, wherein the initial membrane is annealed at a temperature of about 200° C. to about 800° C.

15. The method of claim 13, further comprising flowing an inert gas past the initial membrane during the stretching.

16. A method of forming a pellicle assembly, comprising:
reducing a thickness of an initial membrane to obtain a first nanotube layer for a pellicle membrane, wherein the initial membrane is formed from thick nanotube bundles which have an average diameter of 25 nanometers or greater and which are formed from multi-wall nanotubes and which include at least 25 nanotubes;
combining the first nanotube layer with a second nanotube layer formed from thin nanotube bundles to form the pellicle membrane, wherein the thin nanotube bundles have an average diameter of about 4 nanometers to about 20 nanometers, and include from one to 20 nanotubes; and
affixing the pellicle membrane to a mounting frame to obtain the pellicle assembly.

17. The method of claim 16, further comprising applying a conformal coating to at least an outer surface of the pellicle membrane prior to affixing the pellicle membrane.

18. A method for processing a semiconductor wafer substrate, comprising:
receiving a semiconductor wafer substrate;
forming a photoresist layer on the semiconductor wafer substrate;
exposing the photoresist layer to radiation from a reflective photomask in an exposure tool;
wherein the radiation passes through a pellicle membrane that comprises; a first nanotube membrane layer formed by reducing a thickness of a first membrane formed from thick nanotube bundles which have an average diameter of 25 nanometers or greater, and which are formed from multi-wall nanotubes, and which include at least 25 nanotubes; and
a second nanotube layer formed by reducing a thickness of a second membrane formed from thin nanotube bundles which have an average diameter of about 4 nanometers to about 20 nanometers, and include from one to 20 nanotubes.

19. The method of claim 18, wherein the pellicle membrane further comprises a conformal coating on at least an outer surface of the pellicle membrane.

20. The method of claim 18, wherein the exposure tool is an EUV lithography system or an EUV lithography system having a numerical aperture of greater than 0.5.

* * * * *